United States Patent
Futatsuyama

(10) Patent No.: US 7,558,118 B2
(45) Date of Patent: Jul. 7, 2009

(54) NAND FLASH MEMORY DEVICE

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 11/923,211

(22) Filed: Oct. 24, 2007

(65) Prior Publication Data
US 2008/0247231 A1 Oct. 9, 2008

(30) Foreign Application Priority Data
Oct. 24, 2006 (JP) .................. P2006-288414

(51) Int. Cl.
*G11C 16/04* (2006.01)
(52) U.S. Cl. ................... 365/185.18; 365/185.03
(58) Field of Classification Search ............ 365/185.18, 365/185.03, 185.17, 185.12
See application file for complete search history.

(56) References Cited

U.S. PATENT DOCUMENTS

| 6,807,103 | B2 * | 10/2004 | Cavaleri et al. ........ 365/185.23 |
| 7,099,193 | B2 | 8/2006 | Futatsuyama |
| 2007/0036016 | A1 | 2/2007 | Takeuchi et al. |

FOREIGN PATENT DOCUMENTS

JP  2006-196078  7/2006

OTHER PUBLICATIONS

U.S. Appl. No. 11/923,211, filed Oct. 24, 2007, Futatsuyama.
U.S. Appl. No. 12/058,356, filed Mar. 28, 2008, Abiko, et al.

* cited by examiner

*Primary Examiner*—Vu A Le
(74) *Attorney, Agent, or Firm*—Oblon, Spivak, McClelland, Maier & Neustadt, P.C.

(57) ABSTRACT

A NAND flash memory device includes: a memory cell array that includes a plurality of NAND memory cell units each including a connection element having a plurality of electrically-rewritable memory cells; a plurality of word lines that are connected to the plurality of memory cells; a plurality of bit lines that are connected to the plurality of memory cells; and a read-write control section that applies a voltage selectively to the plurality of word lines and the plurality of bit lines, wherein each of the plurality of NAND memory cell units includes a first select gate transistor and a second select gate transistor; and wherein the read-write control section sets an voltage level applied to word lines, so that the voltage level becomes lower than a predetermined voltage level applied to other word lines connected to control gate electrodes of memory cells.

17 Claims, 23 Drawing Sheets

NAND FLASH MEMORY DEVICE

CROSS-REFERENCE TO RELATED APPLICATIONS

This application is based upon and claims the benefit of priority from Japanese Patent Application No. 2006-288414, filed Oct. 24, 2006, the entire contents of which are incorporated herein by reference.

BACKGROUND OF THE INVENTION

The present invention relates to a NAND flash memory device having a memory cell array in which a plurality of electrically-rewritable memory cells are arranged in a matrix pattern.

The NAND flash memory device has a memory cell array in which a plurality of electrically-rewritable memory cells are arranged in a matrix pattern and which has a plurality of NAND memory cell units; a plurality of word lines and a plurality of bit lines which are connected to the plurality of memory cells; and a read-write control section which applies a voltage selectively to the plurality of word lines and the plurality of bit lines when writing, reading, or erasure of data into or from the plurality of memory cells is performed.

Each of the plurality of NAND memory cell units has a plurality of series-connected memory cells; a first select gate transistor connected between one end of an element consisting of the plurality of series-connected memory cells and the bit line; and a second select gate transistor connected between the other end of the element consisting of the plurality of series-connected memory cells and a source line.

The read-write control section applies a high voltage the first select gate transistor, the second select gate electrode, and the memory cells located adjacent to these gate transistors during writing or reading of data to or from the plurality of memory cells. Since the number of times a high voltage is applied is large, a change arises in the distribution of the threshold values of the memory cells, which may in turn induce erroneous writing of data.

A device described in Patent Document 1 has hitherto been known as a related-art NAND flash memory device. The related-art NAND flash memory device of Patent Document 1 supplies a word line of a selected memory cell with a write voltage for writing data into the memory cell; supplies a word line of a memory cell—which is located closer to a common source line by N (N is an integer of two or more) as compared to the selected memory cell—with a reference voltage for cutting the memory cell off; supplies respective word lines of N−1 memory cells—which are located between the word line of the selected memory cell and the $N^{th}$ memory cell—with an auxiliary voltage which is lower than the write voltage; and supplies word lines of the remaining memory cells with an intermediate voltage which is midway between the write voltage and the reference voltage.

In the related-art NAND flash memory device of JP-A-2005-108404, erroneous writing of data is insufficient because of miniaturization of the memory cells.

SUMMARY OF THE INVENTION

According to an aspect of the present invention, there is provided a NAND flash memory device having: a memory cell array that includes a plurality of NAND memory cell units each including a connection element having a plurality of electrically-rewritable memory cells; a plurality of word lines that are connected to the plurality of memory cells; a plurality of bit lines that are connected to the plurality of memory cells; and a read-write control section that applies a voltage selectively to the plurality of word lines and the plurality of bit lines to perform writing, reading, or erasure of data into or from the plurality of memory cells, wherein each of the plurality of NAND memory cell units includes a first select gate transistor connected between one end of the connection element and the bit lines and a second select gate transistor connected between the other end of the connection element and a source line; and wherein the read-write control section sets an voltage level applied to word lines connected to the control gate electrodes of memory cells adjacent to the second select gate transistor, so that the voltage level becomes lower than a predetermined voltage level applied to other word lines connected to control gate electrodes of memory cells except the memory cells adjacent to the second select gate transistor.

According to another aspect of the present invention, there is provided a NAND flash memory device having: a memory cell array that includes a plurality of NAND memory cell units each including a connection element having a plurality of electrically-rewritable memory cells; a plurality of word lines that are connected to the plurality of memory cells; a plurality of bit lines that are connected to the plurality of memory cells; and a read-write control section that applies a voltage selectively to the plurality of word lines and the plurality of bit lines to perform writing, reading, or erasure of data into or from the plurality of memory cells, wherein each of the plurality of NAND memory cell units includes a first select gate transistor connected between one end of the connection element and the bit lines and a second select gate transistor connected between the other end of the connection element and a source line; and wherein the read-write control section sets a voltage level applied to the word lines connected to the control gate electrodes of memory cells adjacent to the second select gate transistor, so that the voltage level becomes higher than a predetermined voltage level applied to other word lines connected to control gate electrodes of memory cells except the memory cells adjacent to the second select gate transistor.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION OF THE PREFERRED EMBODIMENTS

Embodiments of the present invention will be described in detail hereinbelow by reference to the drawings. The present invention is not limited the embodiments.

First Embodiment

Figure 1:
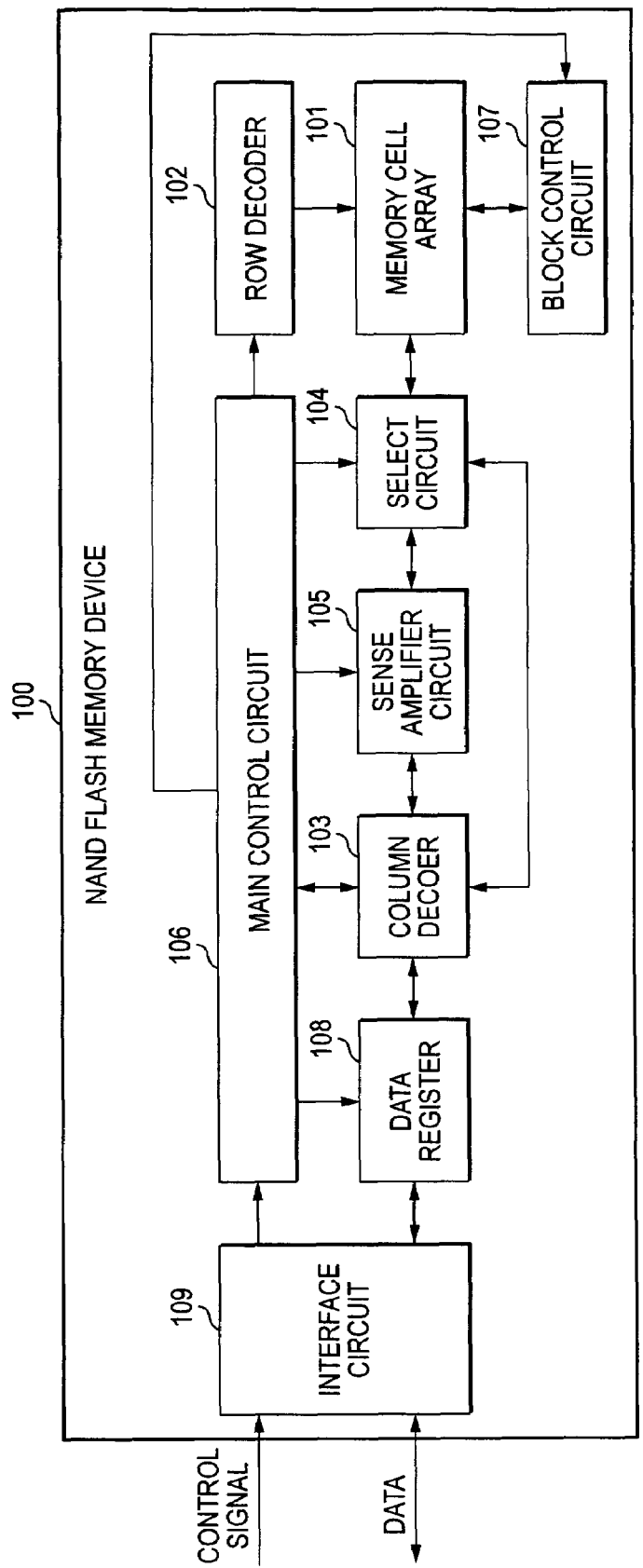
FIG. 1 is an exemplary block diagram showing the configuration of a NAND flash memory device of a first embodiment of the present invention.

A first embodiment of the present invention is described in detail by reference to the drawings. FIG. 1 is a block diagram showing the configuration of a NAND flash memory device of the first embodiment of the present invention.

As shown in FIG. 1, a NAND flash memory device 100 of the first embodiment of the present invention has a memory cell array 101; a row decoder 102; a column decoder 103; a select circuit 104; a sense amplifier circuit 105; a main control circuit 106; a block control circuit 107; a data register 108; and an interface circuit 109.

The interface circuit 109 exchanges data and a control signal (a command, a toggle signal, a clock signal, and the like) with an external device. Upon receipt of data and a control signal from the external device, the interface circuit 109 performs predetermined processing, and sends a result of processing to the main control circuit 106 and the data register 108.

In accordance with the control signal from the interface circuit 109, the main control circuit 106 controls the row decoder 102, the column decoder 103, the select circuit 104, the sense amplifier circuit 105, the block control circuit 107, and the data register 108.

The main control circuit 106 provides the row decoder 102 and the column decoder 103 with information about an access to the memory cells of the memory cell array 101. In accordance with the access information and the data, the row decoder 102 and the column decoder 103 control the sense amplifier circuit 105, the select circuit 104, and the block control circuit 107, thereby reading, writing, or erasing data from or into the memory cells. The main control circuit 106, the row decoder 102, the column decoder 103, the sense amplifier circuit 105, the select circuit 104, and the block control section 107 constitute a read-write control section which selectively applies a voltage to the plurality of word lines and the plurality of bit lines during writing and reading of data into or from the plurality of memory cells of the memory cell array 101.

Figure 3:
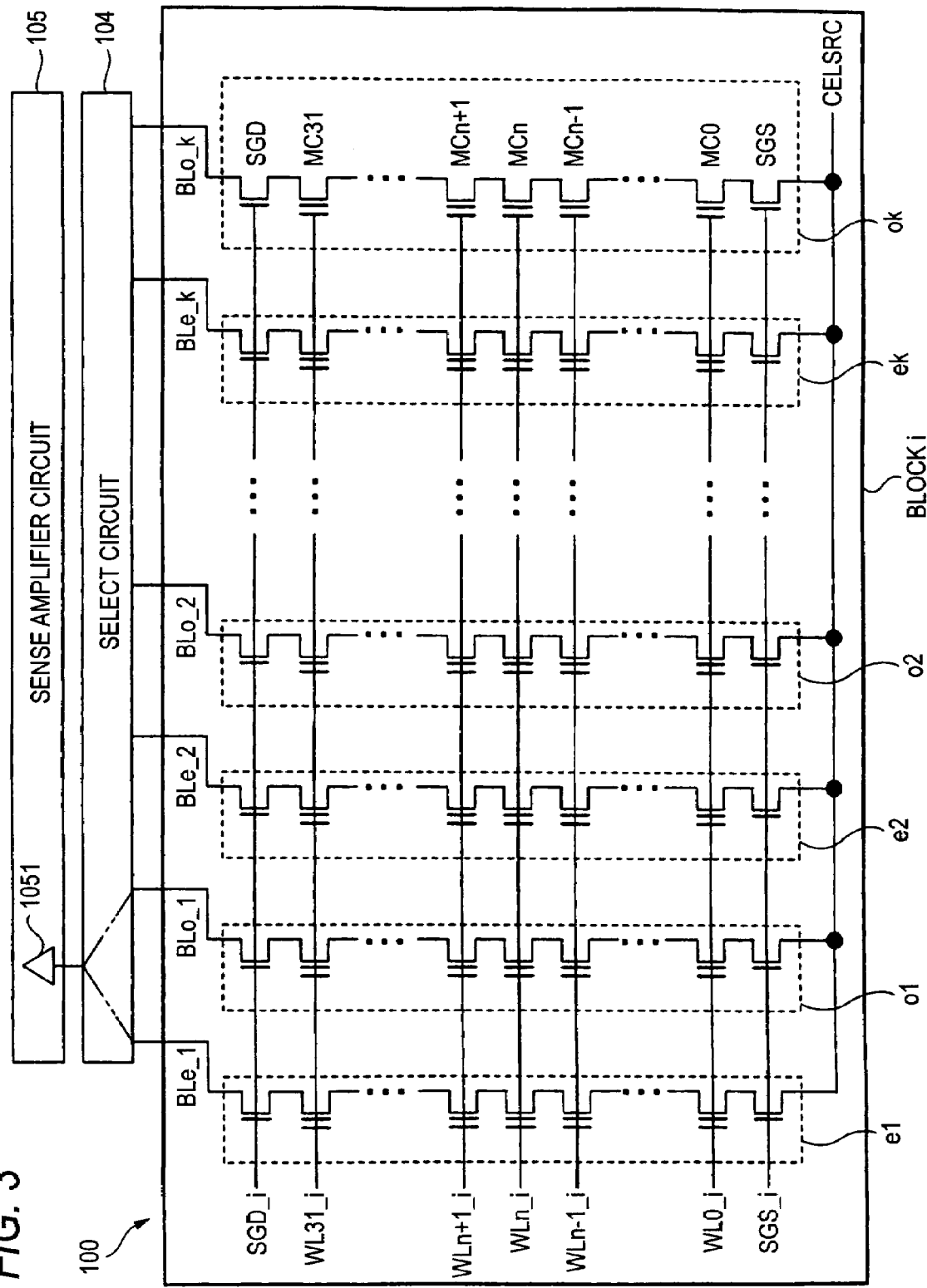
FIG. 3 is an exemplary circuit diagram showing the configuration of a block of a memory cell array.

As shown in FIG. 3, the sense amplifier circuit 105 has a plurality of sense amplifiers 1051; is connected to the bit lines of the memory cell array 101 by way of the select circuit 104; imparts data to the bit lines; and detects potentials of the bit line and retains the thus-detected potentials in a data cache. The main control circuit 106 imparts the data read from the memory cells by the sense amplifier circuit 105 controlled by the column decoder 103 to an external device by way of the data register 108 and the interface circuit 109. The select circuit 104 selects a data cache connected to the bit line among the plurality of data caches constituting the sense amplifier circuit 105.

An example of the memory cell array 101 of the NAND flash memory device 100 according to the first embodiment of the present invention will be described in detail by reference to the drawings.

Figure 2:
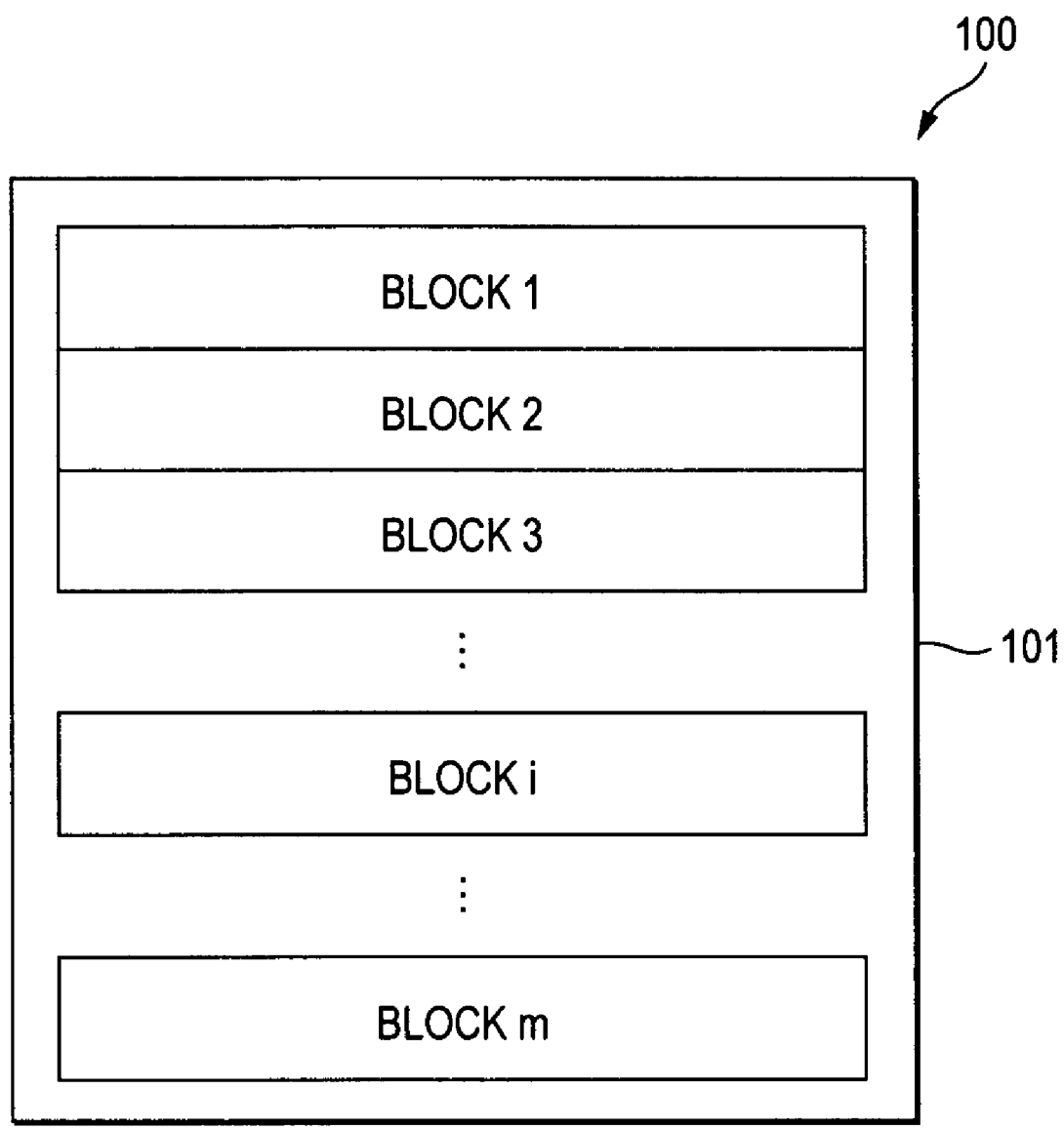
FIG. 2 is an exemplary block diagram showing an example of a memory cell array of the first embodiment of the present invention.

FIG. 2 is a block diagram showing an example of the memory cell array 101 of the first embodiment of the present invention. As shown in FIG. 2, the memory cell array 101 has divided "m" blocks BLOCK1, BLOCK2, BLOCK3, . . . , BLOCKi, . . . , BLOCKm. Here, the term "block" means the minimum unit of data to be deleted by one operation. The blocks BLOCK1, BLOCK2, BLOCK3, . . . BLOCKi, . . . , BLOCKm have the same configuration.

A plurality of electrically-rewritable memory cells are arranged in a matrix pattern in the memory cell array 101, and the memory cell array has a plurality of NAND memory cell units. The plurality of word lines and the plurality of bit lines are connected to the plurality of memory cells. The read-write control section selectively applies a voltage to the plurality of word lines and the plurality of bit lines during writing, reading, or erasure of data into or from the plurality of memory cells.

FIG. 3 is a circuit diagram showing the configuration of one block BLOCKi of the memory cell array 101. As shown in FIG. 3, the block BLOCKi of the memory cell array 101 has 2 ×k NAND cell units e1 to ok.

Each of the NAND memory cell units e1 to ok shown in FIG. 3 has 32 memory cells MC0 to MC31. There may also be the case where one of the memory cells MC0 to MC31 is typically described as a memory cell MC. The memory cells MC0 to MC31 are connected in series. The NAND cell units e1 to ok are at single ends thereof connected to bit lines BLe_1, BLo_1, BLe_2, BLo_2, . . . , BLe_i, BLo_i, . . . , BLe_k, BLo_k.

A control gate electrode of the select gate transistor SGD is connected to a select gate line SGC_i. The NAND cell units e1 to ok are connected at the other ends thereof to a common source line CELSRC by way of the select gate transistor SGS. The control gate electrode of the select gate transistor SGS is connected to a select gate line SGS_i.

Respective control gate electrodes of the respective memory cells MC0 to MC31 are connected to word lines WL (WL0_i to WL31_i). Of the bit lines BLe_1, BLe_2, . . . , BLe_i, . . . , BLe_k, even-numbered bit lines and odd-numbered bit lines counted from the end perform writing and reading of data independently of each other. Data are simultaneously written and read into and from "k" memory cells MC connected to an even-numbered bit line of 2×k memory cells MC connected to one word line WLn_i. Each of the "k" memory cells MC stores; for example, data of two bits (four values). These "k" memory cells MC constitute a unit called "page."

Likewise, data are simultaneously written and read into and from "k" memory cells MC connected to an odd-numbered bit line of the 2×k memory cells MC connected to one word line WLn_i. Each of the "k" memory cells MC stores; for example, data of two bits (four values). These "k" memory cells MC constitute a unit called "page," too.

The present invention is not limited to the illustrated first embodiment of the present invention, and the number of blocks, the number of NAND cell units, the number of serial memory cells, and the number of memory cells may also be changed, as required. In the first embodiment of the present invention, each of the memory cells MC stores data of two bits (four values). Specifically, the read-write control section can write and read data to and from an upper (an upper-level) page and a lower (a lower-level) page of each page. The read-write control section can also write and read data into and from an upper (an upper-level) page and a lower (a lower-level) page of each even-numbered page and each odd-numbered page.

The sense amplifier circuit 105 has the plurality of sense amplifiers 1051. Each of the plurality of sense amplifiers 1051 is selectively connected to either of two bit-line groups; namely, a group consisting of bit lines BLe_1, BLe_2, . . . , BLe_i, . . . BLe_k and a group consisting of bit lines BLo_1, BLo_2, . . . , BLo_i, . . . , BLo_k. The sense amplifier 1051 is called a sense amplifier of bit-line shield type.

In accordance with selection information, the select circuit 104 selects only one of the two bit-line groups and connects the thus-selected bit-line group to the sense amplifier 1051, and takes the remaining bit-line group as an unselected group and does not connect the thus-unselected group to the sense amplifier 1051. In this case, when only data are read, the select circuit 104 connects the bit lines of the unselected bit-line group to the ground, thereby diminishing coupling noise arising between adjacent bit lines. In relation to programmed operation, the select circuit 104 takes the bit lines of the unselected bit-line group as $V_{DD}$, thereby preventing writing of data into the unselected memory cells MC.

The main control circuit 106, the row decoder 102, the column decoder 103, the sense amplifier circuit 105, the select circuit 104, and the block control section 107 (the read-write control section) select a plurality of word lines and a plurality of bit lines from the selected bit-line group and applies a voltage to the thus-selected word lines and bit lines during writing, reading, or erasure of data to or from the plurality of memory cells MC of the memory cell array 101.

In the NAND flash memory device 100 of the first embodiment of the present invention, the main control circuit 106, the row decoder 102, the column decoder 103, the sense amplifier circuit 105, the select circuit 104, and the block control section 107 (the read-write control section) set an erasure verify level—which is applied to word lines WL31_i and WL0_i connected to control gate electrodes of the memory cells MC31 and MC0 during erasure verify operation for erasing data from the memory cells MC31 and MC0 adjacent to the select gate transistor SGD and the select gate transistor SGS—so as to become lower, by first and second predetermined values, than a predetermined erasure verify level applied to other word lines connected to control gate electrodes of the memory cells except the memory cells MC31 and MC0.

Thus, the read-write control section erases data from the memory cells MC31 and MC0 while setting the erasure verify level applied to the word lines WL31_i and WL0_i at the time of erasure verify operation for erasing data from the memory cells MC31 and MC0 so as to become lower, by a predetermined value, than a predetermined erasure verify level applied to other word lines connected to control gate electrodes of the memory cells except the word lines WL31_i and WL0_i.

The first embodiment of the present invention can also be applied to the case where data are written and read into and from an upper (an upper-level) page and a lower (a lower-level) page of each page without making a distinction between an even-numbered page and an odd-numbered page.

According to the first embodiment of the present invention, the erasure verify level applied to the word lines WL31_i and WL0_i is set so as to become lower than the predetermined level of the erasure voltage applied to other word lines by first and second predetermined values. Hence, there can be prevented changing of, to a higher level, the distribution of the threshold values of the memory cells MC31 and MC0 adjacent to the select gate transistor SGD and the select gate transistor SGS. Hence, erroneous writing of data can be effectively prevented.

Second Embodiment

Figure 4:
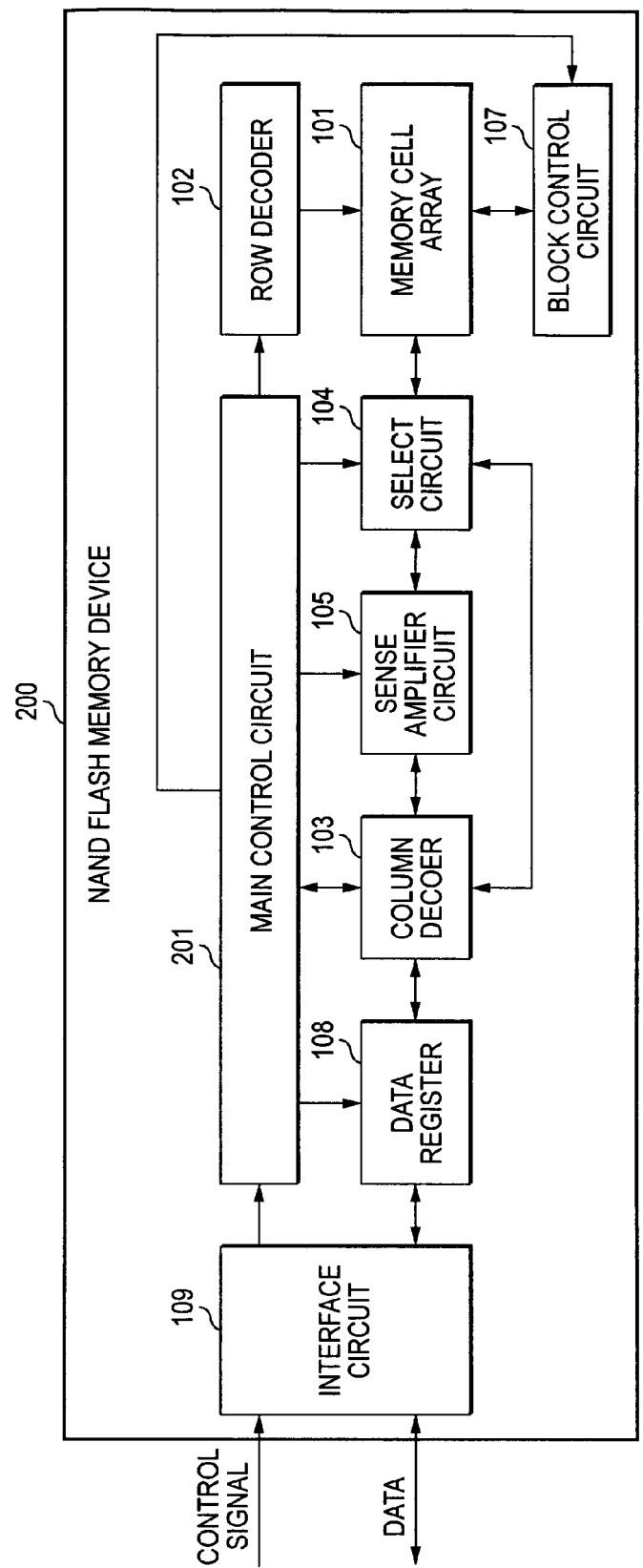
FIG. 4 is an exemplary block diagram showing the configuration of a NAND flash memory device of a second embodiment of the present invention.

A second embodiment of the present invention is now described in detail by reference to the drawings. FIG. 4 is a block diagram showing the configuration of a NAND flash memory device of the second embodiment of the present invention. In the second embodiment of the present invention, constituent elements which are the same as those of the first embodiment of the present invention are assigned the same reference numerals, and their explanations are omitted.

As shown in FIG. 4, a NAND flash memory device 200 of the second embodiment of the present invention has a main control circuit 201 in place of the main control circuit 106 in the NAND flash memory device 100 of the first embodiment of the present invention.

The NAND flash memory device 200 of the second embodiment of the present invention has the memory cell array 101; the row decoder 102; the column decoder 103; the select circuit 104; the sense amplifier circuit 105; the main control circuit 201; the block control circuit 107; the data register 108; and the interface circuit 109.

The main control circuit 201, the row decoder 102, the column decoder 103, the sense amplifier circuit 105, the select circuit 104, and the block control section 107 constitute a read-write control section which selectively applies a voltage to the plurality of word lines and the plurality of bit lines during writing and reading of data into or from the plurality of memory cells of the memory cell array 101. The read-write control section has flag1 for each page. The flag1 is a bit provided for each page (at least lower pages of the memory cells WL0 and WL31) and stores whether or not data pertaining to a lower page have been written. When data pertaining to a lower page having flag1 are written, a memory cell having flag1 is changed from one (an erased state) to zero (a written state). When flag1=0 is achieved, flag1 is assumed to store that data pertaining to a lower page have been written. In relation to sequence of writing of data, writing of data pertaining to a lower page of each page is assumed to be performed prior to writing of data pertaining to an upper page of the page, and writing of data pertaining to an even-numbered page is assumed to be performed writing of data pertaining to an odd-numbered page.

In the second embodiment of the present invention, the read-write control section sets a write verify level—which is applied to the word lines WL31_i and WL0_i connected to control gate electrodes of the memory cells MC31 and MC0 during write operation for writing data pertaining to a lower page of an even-numbered page into the memory cells MC31 and MC0 adjacent to the select gate transistor SGD and the select gate transistor SGS—so as to become lower, by first and second predetermined values, than a predetermined write verify level applied to other word lines connected to control gate electrodes of the memory cells except the memory cells MC31 and MC0.

In the second embodiment of the present invention, the read-write control section sets a read level—which is applied to the word lines WL31_i and WL0_i connected to the control gate electrodes of the memory cells MC31 and MC0 when data pertaining to a lower page of an odd-numbered page are not written during read operation for reading data pertaining to the lower page of the even-numbered page from the memory cells MC31 and MC0 adjacent to the select gate transistor SGD and the select gate transistor SGS—so as to become lower, by third and fourth predetermined values, than a predetermined read level applied to other word lines connected to control gate electrodes of the memory cells except the memory cells MC31 and MC0.

Figure 5:
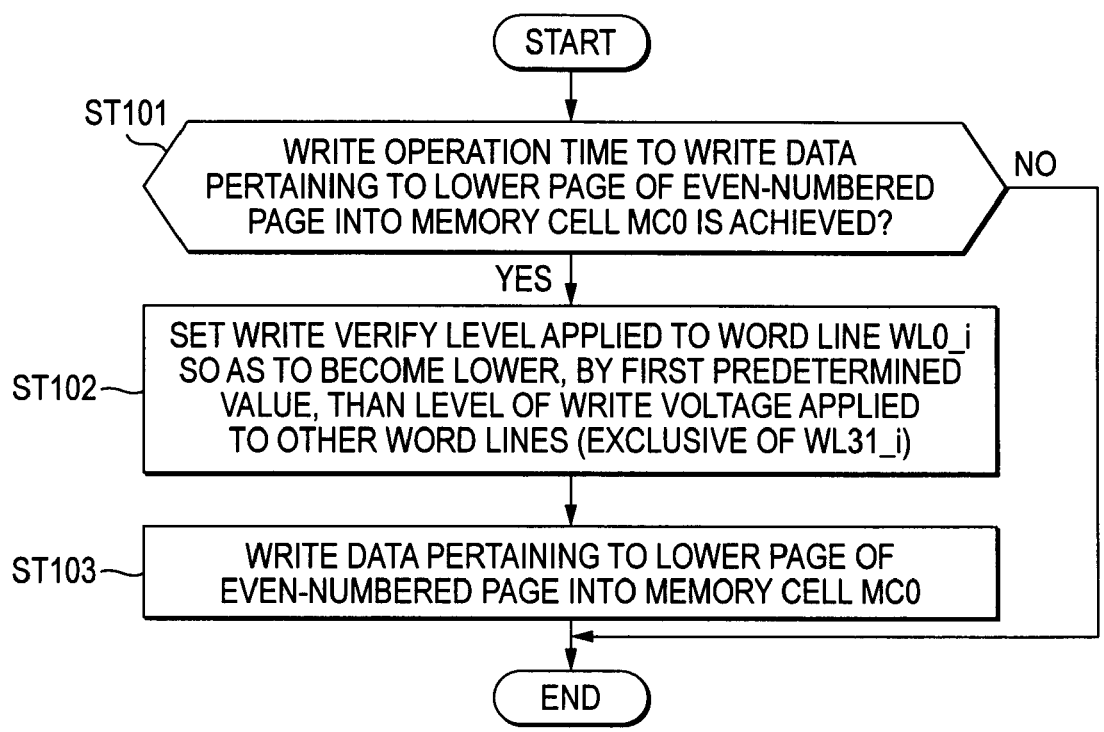
FIG. 5 is an exemplary flowchart for describing a portion of a read-write control section of the second embodiment of the present invention.
Figure 6:
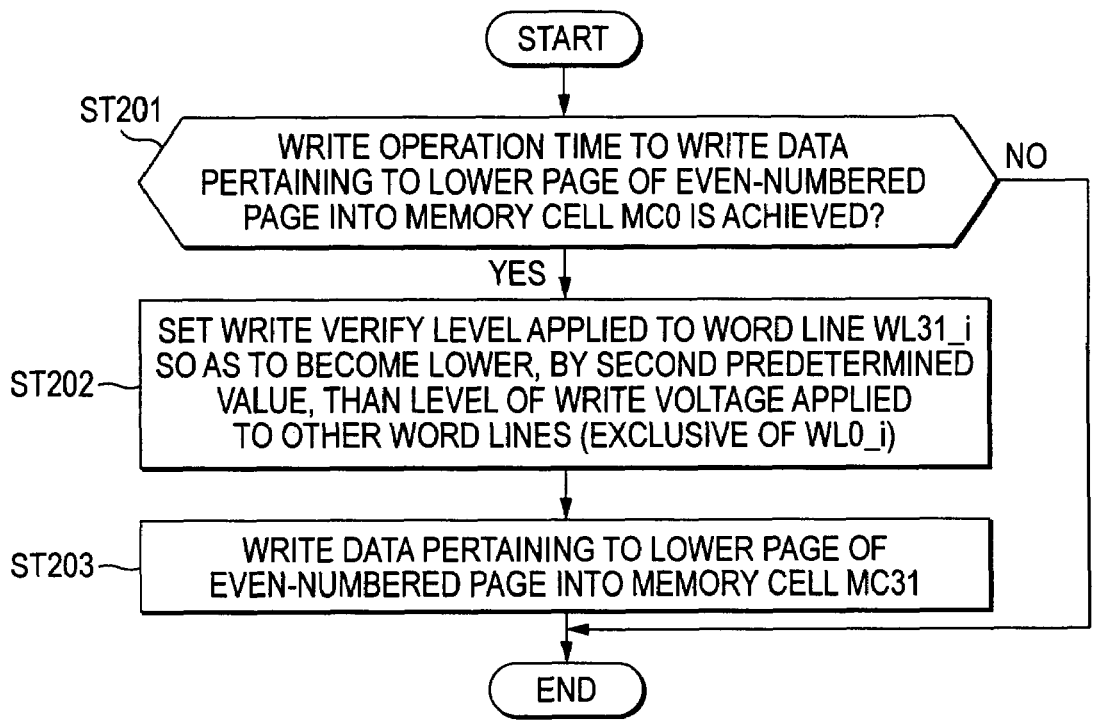
FIG. 6 is an exemplary flowchart for describing a portion of a read-write control section of the second embodiment of the present invention.
Figure 7:
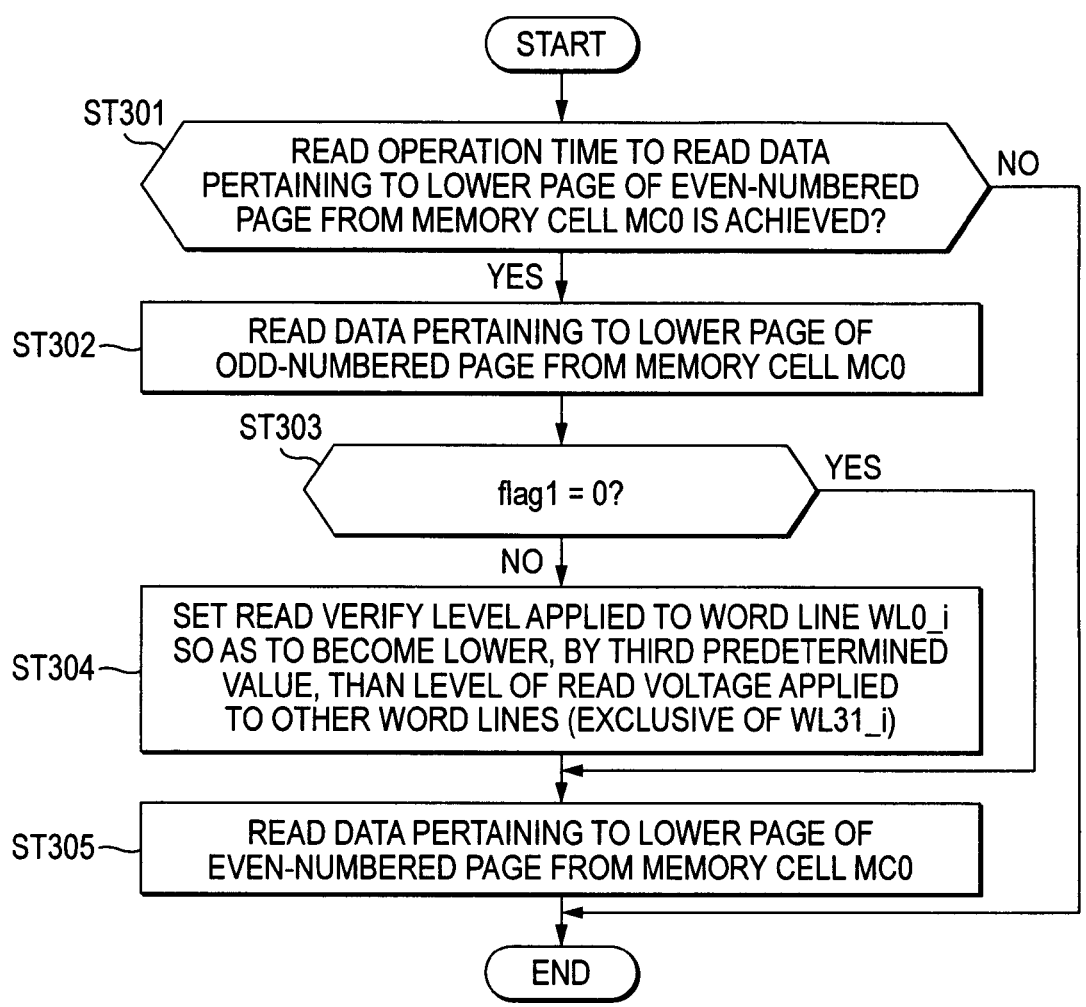
FIG. 7 is an exemplary flowchart for describing a portion of a read-write control section of the second embodiment of the present invention.
Figure 8:
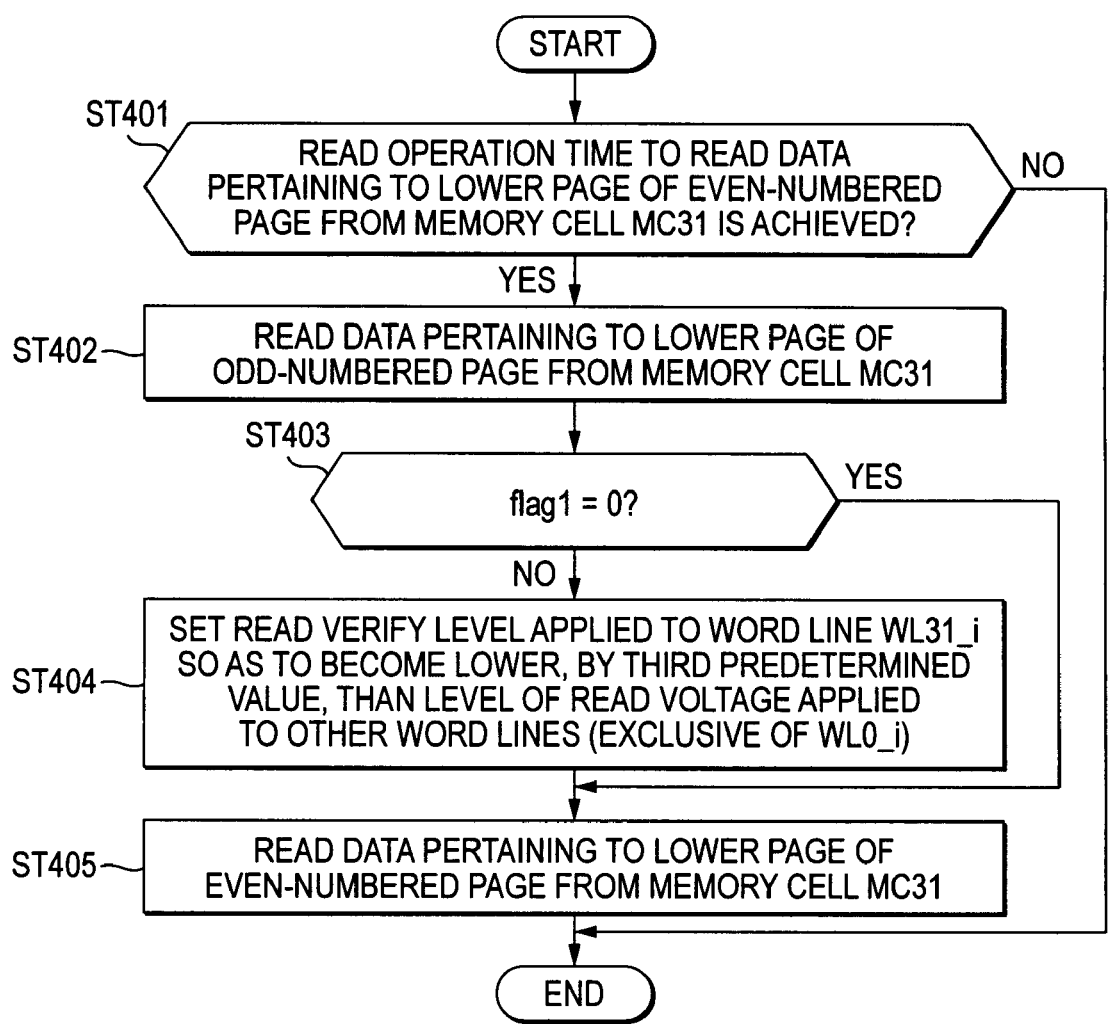
FIG. 8 is an exemplary flowchart for describing a portion of a read-write control section of the second embodiment of the present invention.

By reference to FIGS. 5 through 8, operation of the read-write control section of the second embodiment of the present invention is described specifically. FIG. 5 is a flowchart for describing a portion of the operation for writing the data pertaining to a lower page of an even-numbered page into the memory cell MC0 of the read-write control section of the second embodiment of the present invention. FIG. 6 is a flowchart for describing a portion of the operation for writing the data pertaining to the lower page of the even-numbered page into the memory cell MC31 of the read-write control section of the second embodiment of the present invention. FIG. 7 is a flowchart for describing a portion of the operation for reading the data pertaining to a lower page of an even-numbered page into the memory cell MC0 of the read-write control section of the second embodiment of the present invention. FIG. 8 is a flowchart for describing a portion of the operation for reading the data pertaining to the lower page of the even-numbered page into the memory cell MC31 of the read-write control section of the second embodiment of the present invention.

As shown in FIG. 5, in step ST101, the read-write control section determines whether or not a write operation time to write data pertaining to the lower page of the even-numbered page into the memory cell MC0 is achieved.

When the write operation time to write data pertaining to the lower page of the even-numbered page into the memory cell MC0 is determined to be achieved in step ST101, the read-write control section sets the write verify level applied to the word line WL0_i so as to become lower than the write verify level applied to other word lines (exclusive of the word line WL31_i) by a first predetermined value (step ST102).

Next, the read-write control section writes data pertaining to a lower page of the even-numbered page into the memory cell MC0 (step ST103).

As shown in FIG. 6, in step ST201, the read-write control section determines whether or not a write operation time to write data pertaining to a lower page of an even-numbered page into the memory cell MC31 is achieved.

When the write operation time to write data pertaining to a lower page of an even-numbered page into the memory cell MC31 is determined to be achieved in step ST201, the read-write control section sets a write verify level applied to the word line WL31_i so as to become lower than the write verify level applied to other word lines (exclusive of the word line WL31_i) by a second predetermined value (step ST202).

Next, the read-write control section writes data pertaining to the lower page of the even-numbered page into the memory cell MC31 (step ST203).

As shown in FIG. 7, in step ST301, the read-write control section determines whether or not a read operation time to read data pertaining to a lower page of an even-numbered page from the memory cell MC0 is achieved. When the read operation time to read data pertaining to a lower page of an even-numbered page from the memory cell MC0 is determined to be achieved in step ST301, the read-write control section reads data pertaining to a lower page of an odd-numbered page from the memory cell MC0 (step ST302).

On the basis of a result of reading of data performed in step ST302, the read-write control section determines whether or not flag1 of the data pertaining to the lower page of the odd-numbered page in the memory cell MC0 is equal to zero (step ST303).

When flag1 is determined not to be equal to zero in step ST303, the read-write control section sets a write verify level applied to the word line WL0_i so as to become lower than the write verify level applied to other word lines (exclusive of the word line WL31_i) by a third predetermined value (step ST304).

When flag1=0 is determined in step ST303 or after processing pertaining to step ST304, the read-write control section reads the data pertaining to the lower page of the even-numbered page from the memory cell MC0 (step ST305).

As shown in FIG. 8, in step ST401, the read-write control section determines whether or not a read operation time to read the data pertaining to a lower page of an even-numbered page from the memory cell MC31 is achieved. When the read operation time to read the data pertaining to the lower page of the even-numbered page into the memory cell MC31 is determined to be achieved in step ST301, the read-write control section reads data pertaining to a lower page of an odd-numbered page from the memory cell MC0 (step ST402).

On the basis of a result of reading of data performed in step ST402, the read-write control section determines whether or not flag1 of the data pertaining to the lower page of the odd-numbered page in the memory cell MC31 is equal to zero (step ST403).

When flag1 is determined not to be equal to zero in step ST503, the read-write control section sets a read level applied to the word line WL31_i so as to become lower than the read level applied to other word lines (exclusive of the word line WL0_i) by the third predetermined value (step ST404).

When flag1=0 is determined in step ST403 or after processing pertaining to step ST404, the read-write control section reads the data pertaining to the lower page of the even-numbered page from the memory cell MC31 (step ST405).

According to the second embodiment of the present invention, the write verify level—which is applied to the word lines WL31_i and WL0_i when the data pertaining to the lower page of the even-numbered page are written into the memory cells MC31 and MC0—is set so as to become lower than a predetermined write verify level applied to other word lines by the first and second predetermined values. Further, the read level—which is applied to the word lines WL31_i and WL0_i when the data pertaining to the lower page of the odd-numbered page are not written during the read operation for reading data pertaining to the lower page of the even-numbered page from the memory cells MC31 and the MC0—is set so as to become lower than a predetermined read level applied to other word lines by the third and fourth predetermined values. As a result, a change in the distribution of the threshold values of the memory cells MC31 and MC0 adjacent to the select gate transistor SGD and the select gate transistor SGS can be canceled, and a shift in the distribution of the threshold values of the memory cells, which would otherwise be caused by erroneous writing of data, can be canceled.

Third Embodiment

Figure 9:
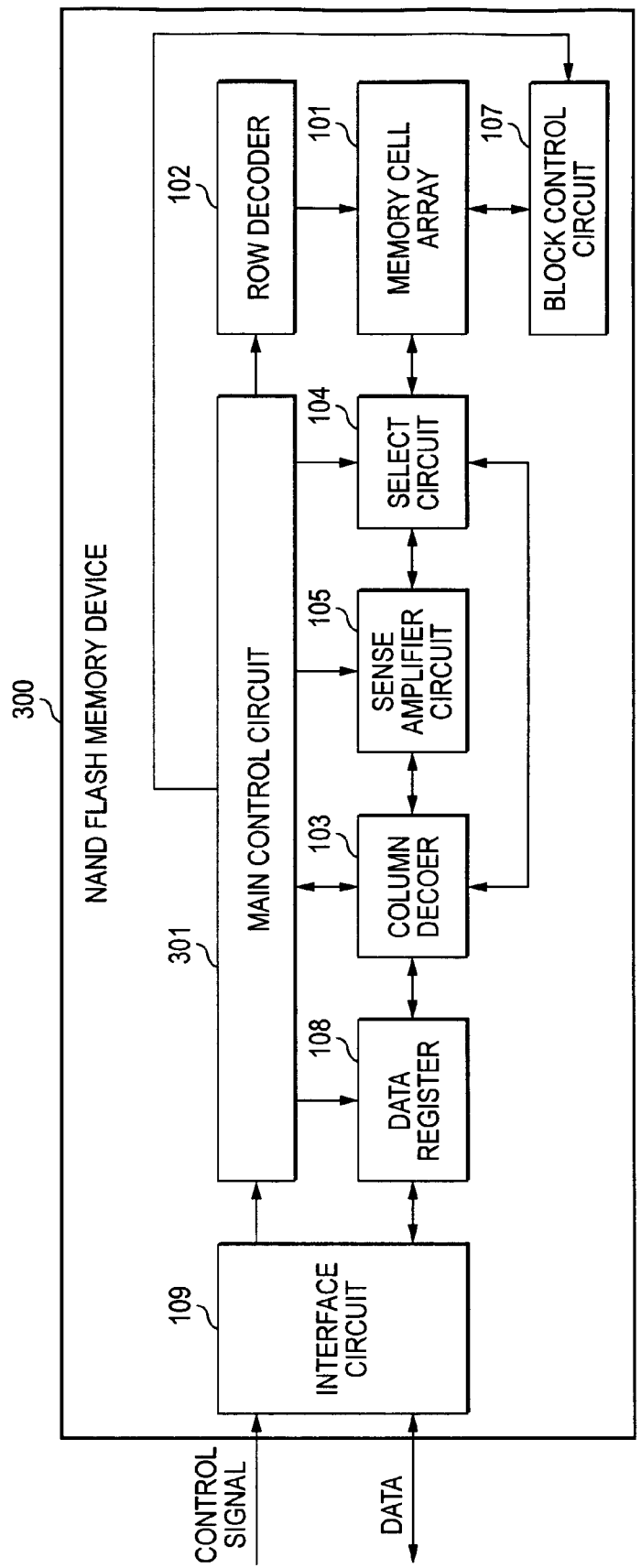
FIG. 9 is an exemplary block diagram showing the configuration of a NAND flash memory device of a third embodiment of the present invention.

A third embodiment of the present invention is now described in detail by reference to the drawings. FIG. 9 is a block diagram showing the configuration of a NAND flash memory device of the third embodiment of the present invention. In the third embodiment of the present invention, constituent elements which are the same as those of the first embodiment of the present invention are assigned the same reference numerals, and their explanations are omitted.

As shown in FIG. 9, a NAND flash memory device 300 of the third embodiment of the present invention has a main control circuit 301 in place of the main control circuit 106 in the NAND flash memory device 100 of the first embodiment of the present invention.

The NAND flash memory device 300 of the third embodiment of the present invention has the memory cell array 101; the row decoder 102; the column decoder 103; the select circuit 104; the sense amplifier circuit 105; the main control circuit 301; the block control circuit 107; the data register 108; and the interface circuit 109.

The main control circuit 301, the row decoder 102, the column decoder 103, the sense amplifier circuit 105, the select circuit 104, and the block control section 107 constitute a read-write control section which selectively applies a voltage to the plurality of word lines and the plurality of bit lines during writing and reading of data into or from the plurality of memory cells of the memory cell array 101. The read-write control section has flag1 for each page.

In the third embodiment of the present invention, the read-write control section sets the read level—which is applied to the word lines WL31_i and WL0_i connected to control gate electrodes of the memory cells MC31 and MC0 during read operation for reading data pertaining to a lower page of an even-numbered page from the memory cells MC31 and MC0 adjacent to the select gate transistor SGD and the select gate transistor SGS—so as to become lower, by the first and second predetermined values, than a predetermined read level applied to other word lines connected to control gate electrodes of the memory cells except the memory cells MC31 and MC0.

Figure 10:
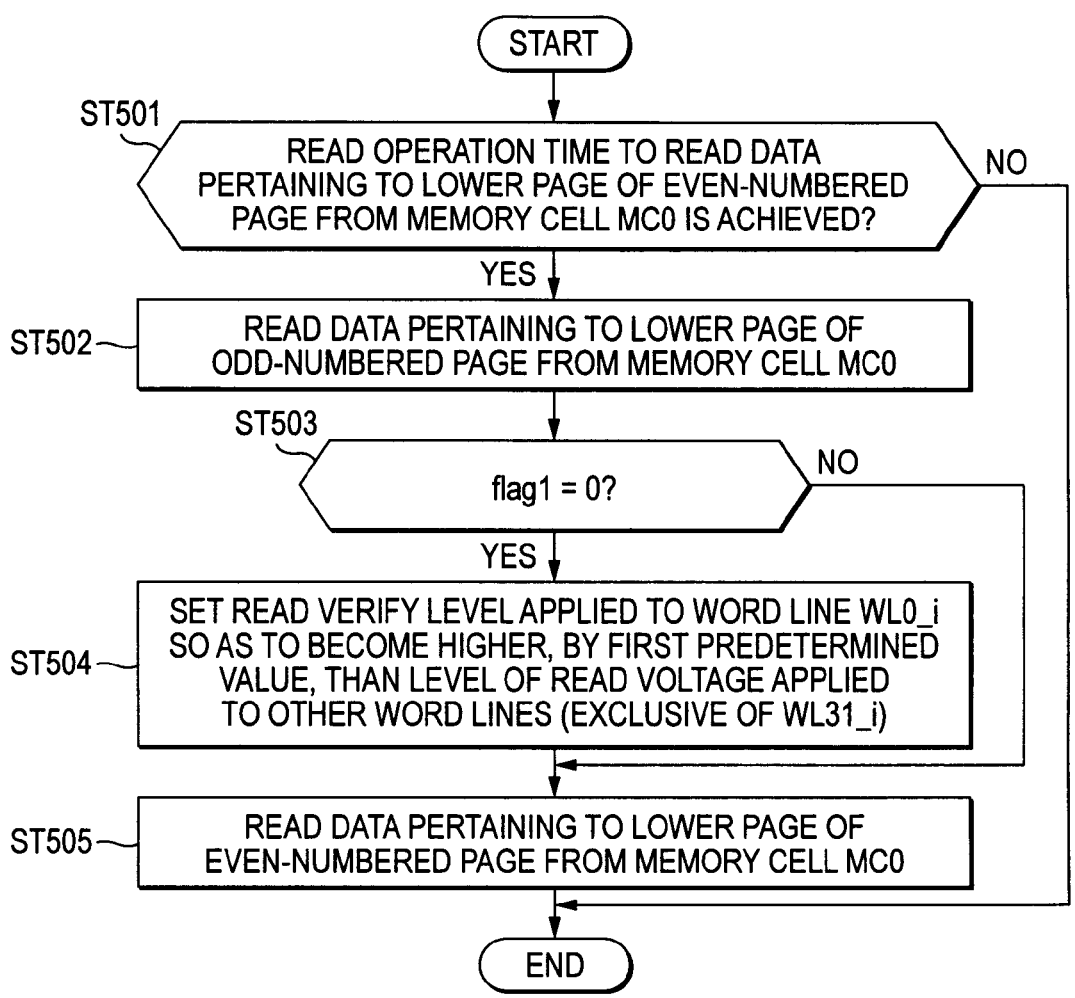
FIG. 10 is an exemplary flowchart for describing a portion of a read-write control section of the third embodiment of the present invention.
Figure 11:
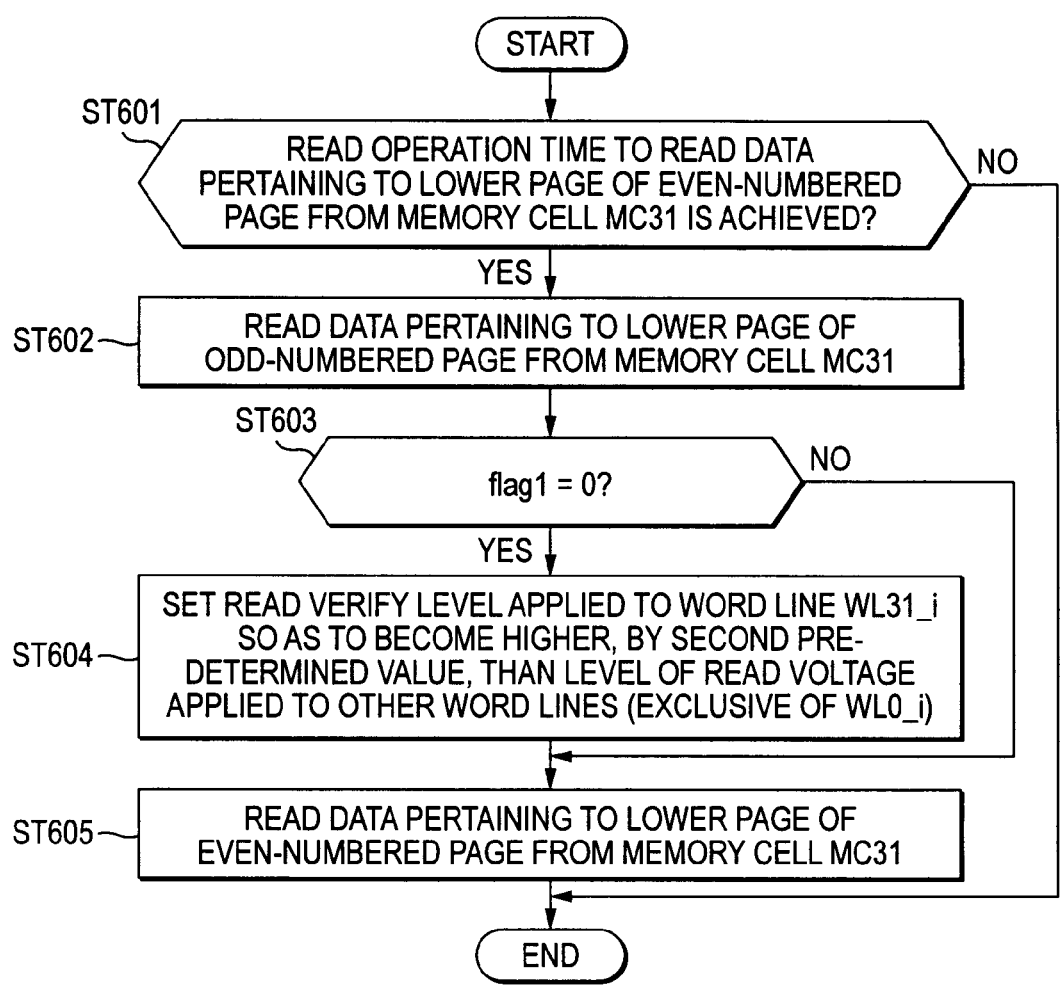
FIG. 11 is an exemplary flowchart for describing a portion of a read-write control section of the third embodiment of the present invention.

By reference to FIGS. 10 and 11, operation of the read-write control section of the third embodiment of the present invention is described specifically. FIG. 10 is a flowchart for describing a portion of the operation for reading data pertaining to a lower page of an even-numbered page into the memory cell MC0 of the read-write control section of the second embodiment of the present invention. FIG. 11 is a flowchart for describing a portion of the operation for reading data pertaining to a lower portion of an even-numbered page into the memory cell MC31 of the read-write control section of the second embodiment of the present invention.

As shown in FIG. 10, in step ST501, the read-write control section determines whether or not a read operation time to read data pertaining to a lower page of an even-numbered page from the memory cell MC0 is achieved. When the read operation time to read data pertaining to the lower page of the even-numbered page from the memory cell MC0 is determined to be achieved in step ST501, the read-write control section reads data pertaining to a lower page of an odd-numbered page from the memory cell MC0 (step ST502).

On the basis of a result of reading of data performed in step ST502, the read-write control section determines whether or not flag1 of the data pertaining to the lower page of the odd-numbered page in the memory cell MC0 is equal to zero (step ST503).

When flag1 is determined to be equal to zero in step ST503, the read-write control section sets a read level applied to the word line WL0_i so as to become higher than the read level applied to other word lines (exclusive of the word line WL31_i) by the first predetermined value (step ST504).

When flag1=0 is determined not to be achieved in step ST503 or after processing pertaining to step ST504, the read-write control section reads the data pertaining to the lower page of the even-numbered page from the memory cell MC0 (step ST505).

As shown in FIG. 11, in step ST601, the read-write control section determines whether or not a read operation time to read the data pertaining to a lower page of an even-numbered page from the memory cell MC31 is achieved. When the read operation time to read the data pertaining to the lower page of the even-numbered page into the memory cell MC31 is determined to be achieved in step ST601, the read-write control section reads data pertaining to a lower page of an odd-numbered page from the memory cell MC31 (step ST602).

On the basis of a result of reading of data performed in step ST601, the read-write control section determines whether or not flag1 of the data pertaining to the lower page of the odd-numbered page in the memory cell MC31 is equal to zero (step ST603).

When flag1 is determined not to be equal to zero in step ST603, the read-write control section sets a read level applied to the word line WL31_i so as to become lower than the read level applied to other word lines (exclusive of the word line WL0_i) by the third predetermined value (step ST604).

When flag1=0 is determined in step ST603 or after processing pertaining to step ST604, the read-write control section reads the data pertaining to the lower page of the even-numbered page from the memory cell MC31 (step ST605).

According to the third embodiment of the present invention, the read level—which is applied to the word lines WL31_i and WL0_i when the data pertaining to the lower page of the even-numbered page are read from the memory cells MC31 and MC0—is set so as to become lower than a predetermined read level applied to other word lines by the first and second predetermined values. As a result, a change in the distribution of the threshold values of the memory cells MC31 and MC0 adjacent to the select gate transistor SGD and the select gate transistor SGS can be canceled, and a shift in the distribution of the threshold values of the memory cells, which would otherwise be caused by erroneous writing of data, can be canceled.

Fourth Embodiment

Figure 12:
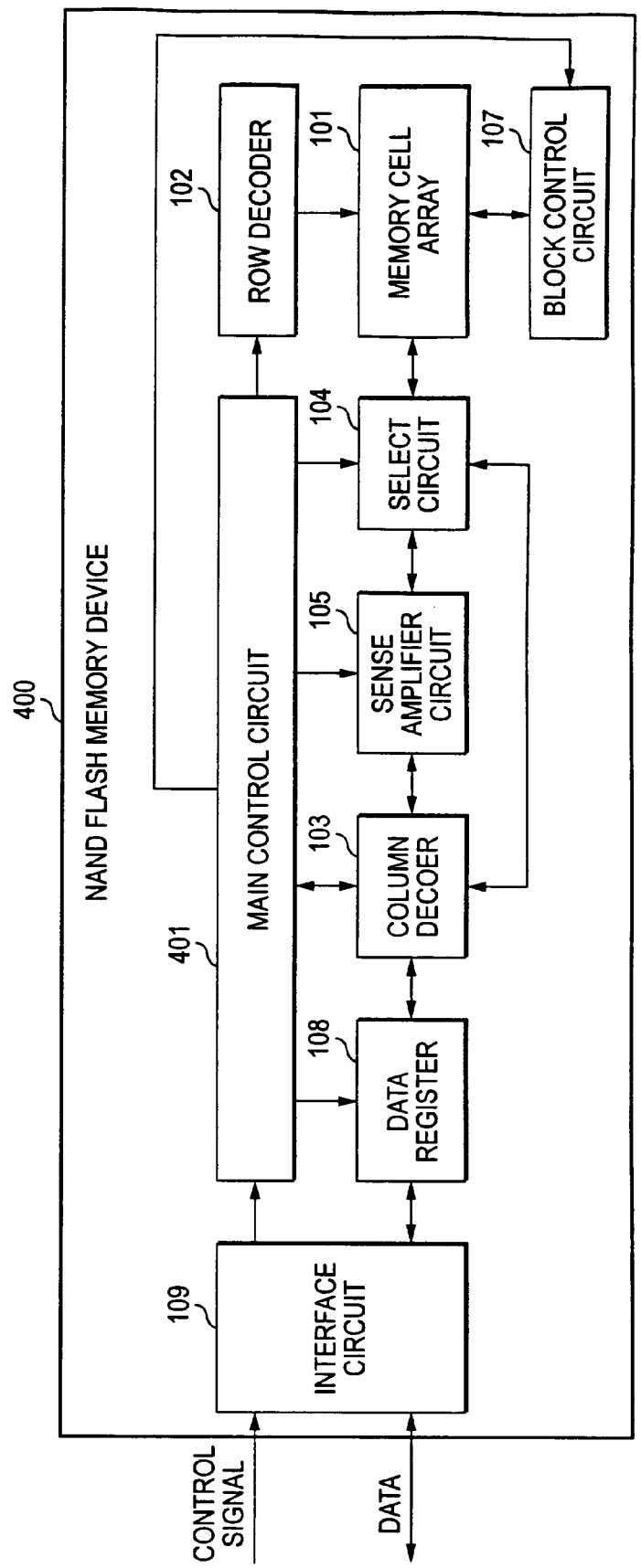
FIG. 12 is an exemplary block diagram showing the configuration of a NAND flash memory device of a fourth embodiment of the present invention.

A fourth embodiment of the present invention is now described in detail by reference to the drawings. FIG. 12 is a block diagram showing the configuration of a NAND flash memory device of the fourth embodiment of the present invention. In the fourth embodiment of the present invention, constituent elements which are the same as those of the first embodiment of the present invention are assigned the same reference numerals, and their explanations are omitted.

As shown in FIG. 12, a NAND flash memory device 400 of the fourth embodiment of the present invention has a main control circuit 401 in place of the main control circuit 106 in the NAND flash memory device 100 of the first embodiment of the present invention.

The NAND flash memory device 400 of the fourth embodiment of the present invention has the memory cell array 101; the row decoder 102; the column decoder 103; the select circuit 104; the sense amplifier circuit 105; the main control circuit 401; the block control circuit 107; the data register 108; and the interface circuit 109.

The main control circuit 401, the row decoder 102, the column decoder 103, the sense amplifier circuit 105, the select circuit 104, and the block control section 107 constitute a read-write control section which selectively applies a voltage to the plurality of word lines and the plurality of bit lines during writing and reading of data into or from the plurality of memory cells of the memory cell array 101. The read-write control section has flag1 for each page. The read-write control section also has flag2 for each page. The flag2 is a bit belonging to each page (at least upper pages of the memory cells WL0 and WL31) and stores whether or not data pertaining to an upper page have been performed. When data pertaining to an upper page having flag2 are written, a memory cell having flag2 is changed from one (an erased state) to zero (a written state). Specifically, when flag2=0 is achieved, flag2 is assumed to store that data pertaining to an upper page have been written. Further, in order to ensure the reliability of the memory cells, it is desirable that flag2 should differ from flag1. Specifically, it is desirable that the memory cell storing flag1 and flag2 should retain data as binary data. Even when flag1 and flag2 are stored in a single memory cell (in the form of a multiple value), the present invention yields a similar advantage.

In the fourth embodiment of the present invention, the read-write control section sets a write verify level—which is applied to the word lines WL31_i and WL0_i connected to the control gate electrodes of the memory cells MC31 and MC0 when data pertaining to an upper page of the odd-numbered page are not written during write operation for writing data pertaining to an upper page of an even-numbered page or data pertaining to a lower page of an odd-numbered page into the memory cells MC31 and MC0 adjacent to the select gate transistor SGD and the select gate transistor SGS—so as to become lower than a predetermined write verify level—applied to other word lines connected to control gate electrodes of the memory cells except the memory cells MC31 and MC0—by the first and second predetermined values in connection with the data pertaining to an upper page of an even-numbered page and also lower than the same by the third and fourth predetermined values in connection with the data pertaining to a lower page of an odd-numbered page.

In the fourth embodiment of the present invention, the read-write control section sets a read level—which is applied to the word lines WL31_i and WL0_i connected to the control gate electrodes of the memory cells MC31 and MC0 when data pertaining to an upper page of the odd-numbered page are not written during read operation for reading data pertaining to an upper page of an even-numbered page from the memory cells MC31 and MC0 adjacent to the select gate transistor SGD and the select gate transistor SGS—so as to become lower, by fifth and sixth predetermined values, than a predetermined read level applied to other word lines connected to control gate electrodes of memory cells except the memory cells MC31 and MC0.

In the fourth embodiment of the present invention, the read-write control section sets a read level—which is applied to the word lines WL31_i and WL0_i connected to the control gate electrodes of the memory cells MC31 and MC0 when data pertaining to an upper page of the even-numbered page are not written during read operation for reading data pertaining to a lower page of the odd-numbered page from the memory cells MC31 and MC0 adjacent to the select gate transistor SGD and the select gate transistor SGS—so as to become lower, by seventh and eighth predetermined values, than a predetermined read level applied to other word lines connected to control gate electrodes of memory cells except the memory cells MC31 and MC0.

Figure 13:
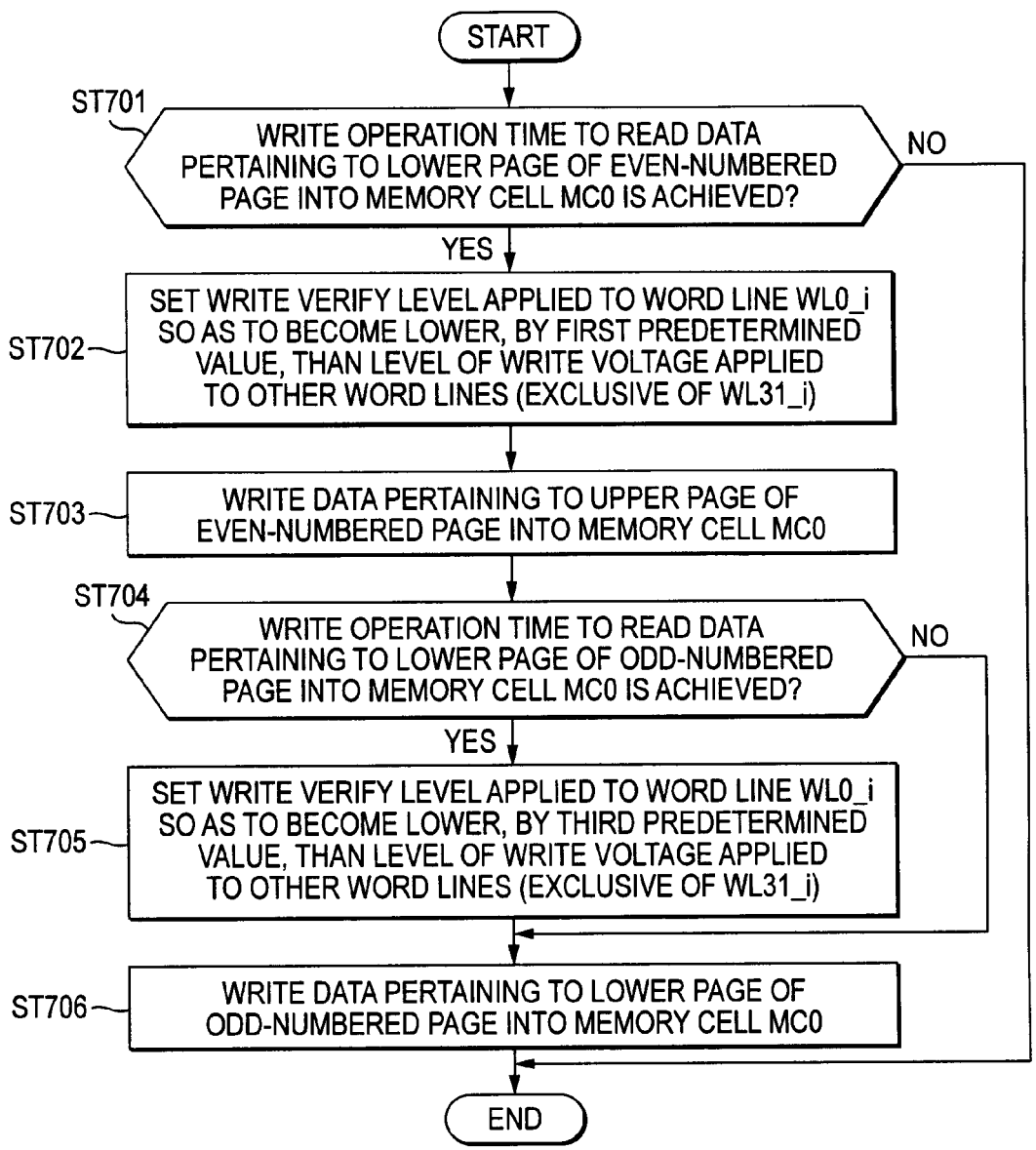
FIG. 13 is an exemplary flowchart for describing a portion of a read-write control section of the fourth embodiment of the present invention.
Figure 14:
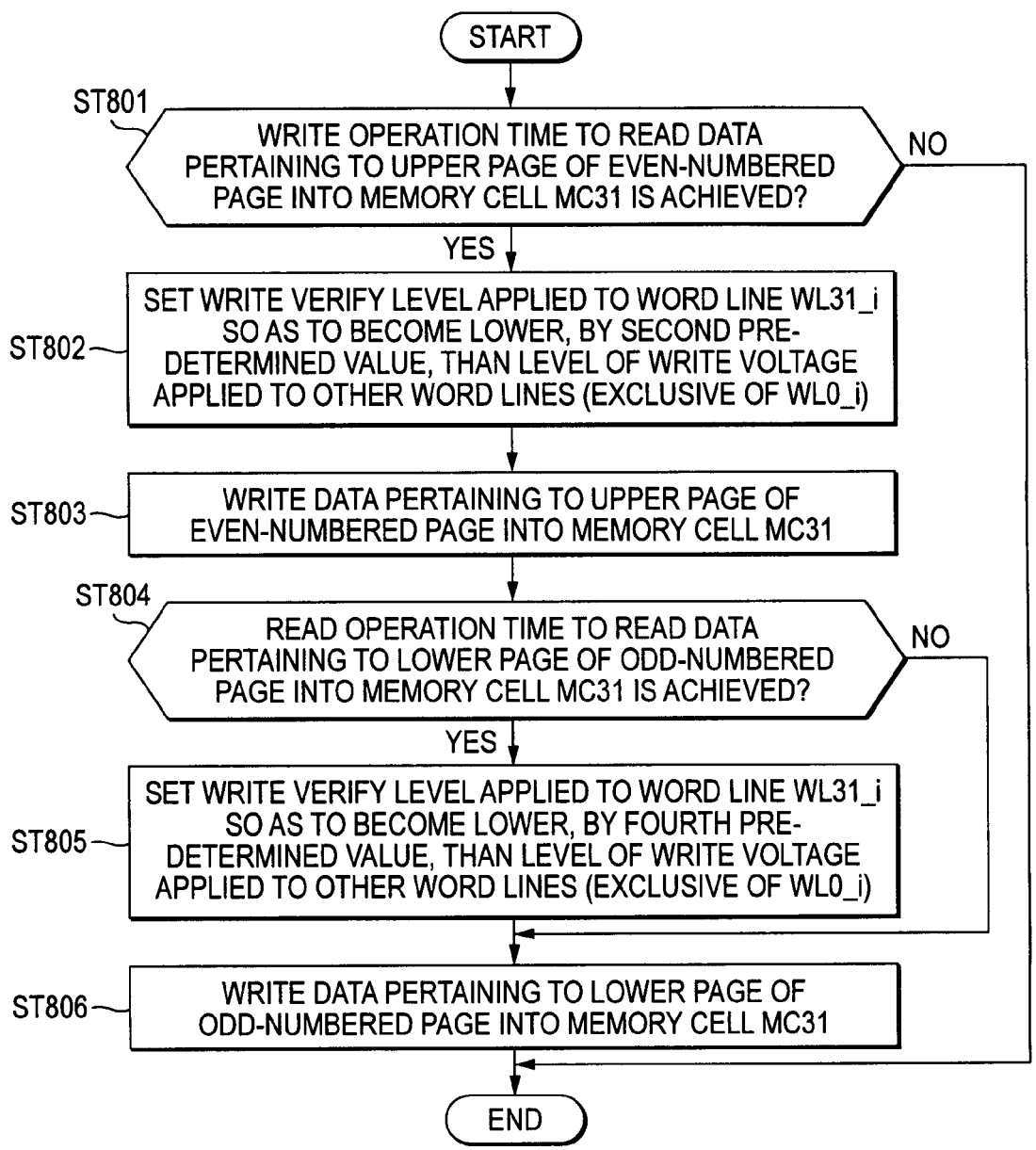
FIG. 14 is an exemplary flowchart for describing a portion of a read-write control section of the fourth embodiment of the present invention.
Figure 15:
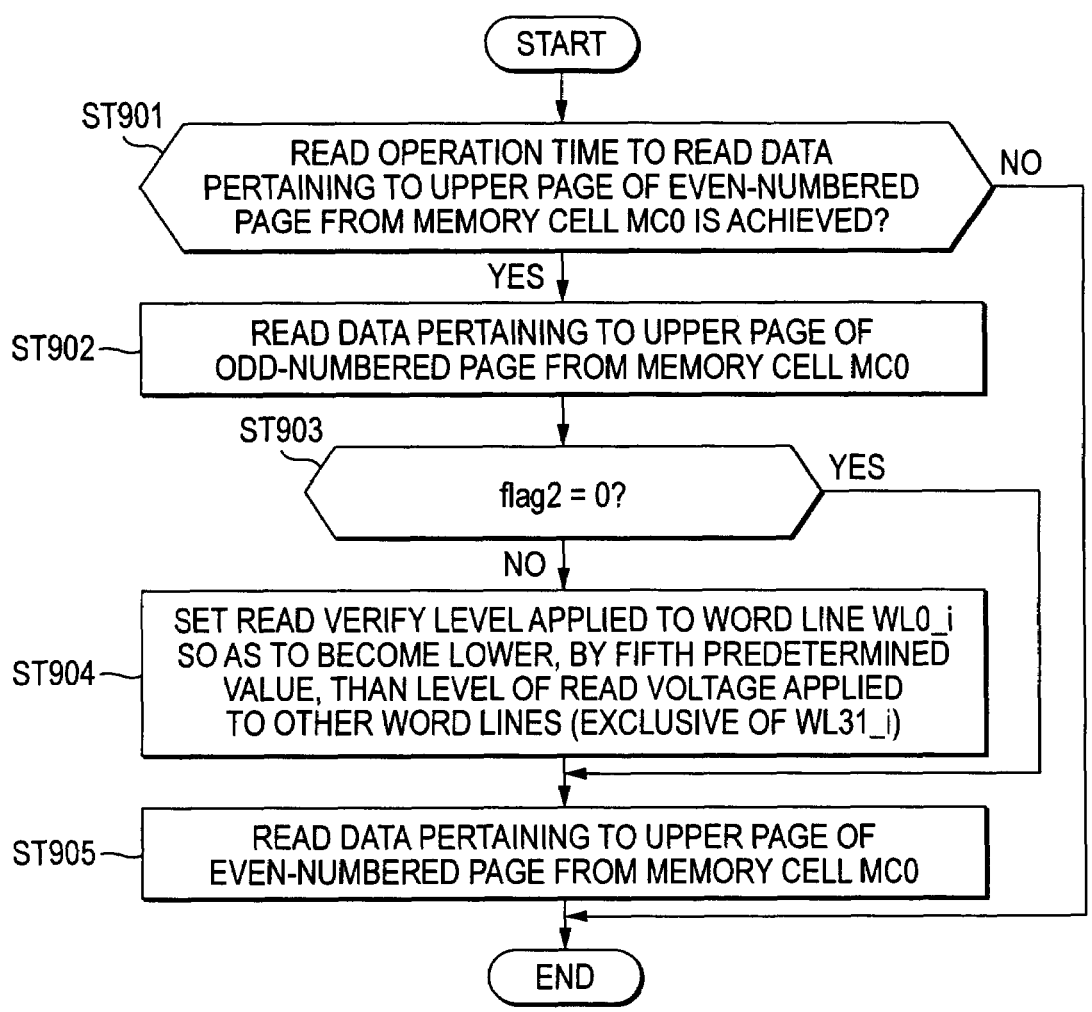
FIG. 15 is an exemplary flowchart for describing a portion of a read-write control section of the fourth embodiment of the present invention.
Figure 16:
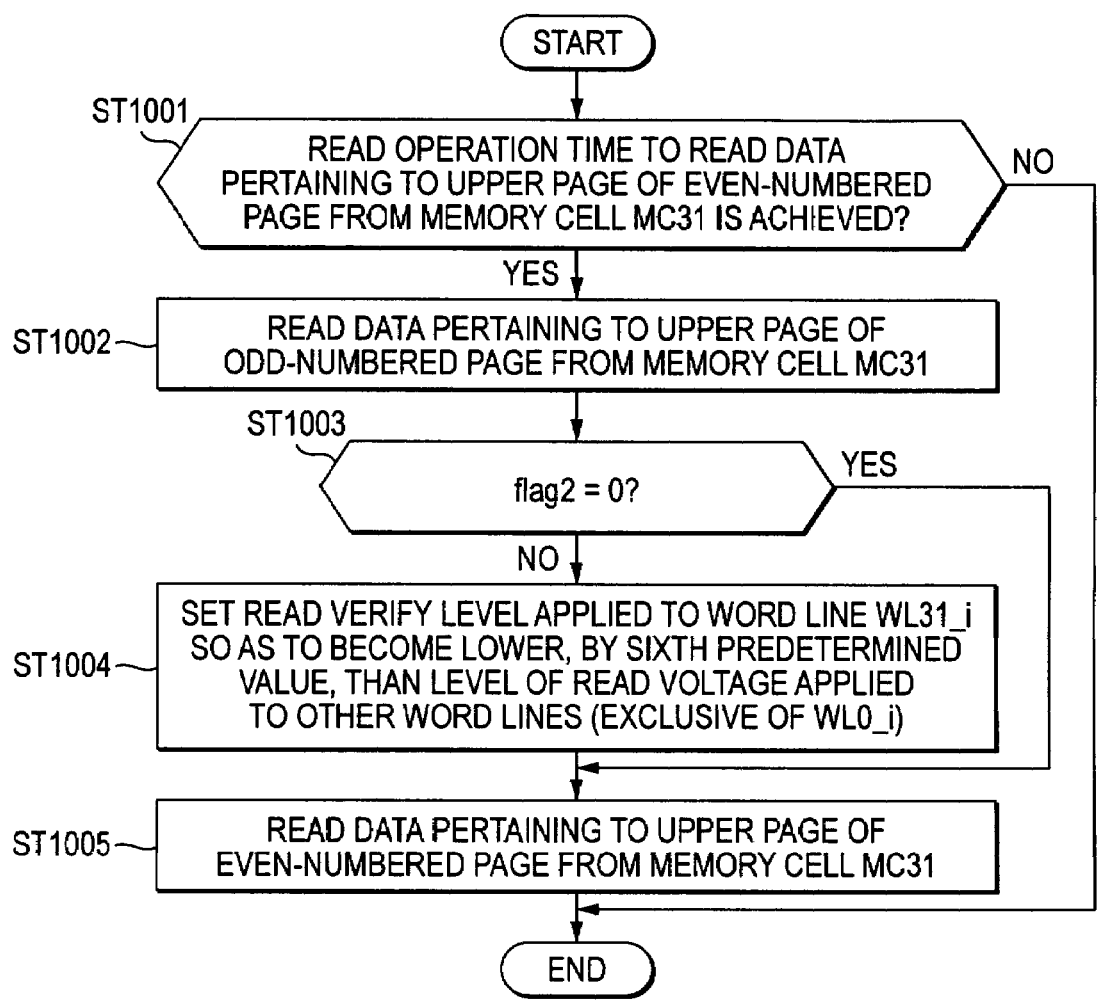
FIG. 16 is an exemplary flowchart for describing a portion of a read-write control section of the fourth embodiment of the present invention.
Figure 17:
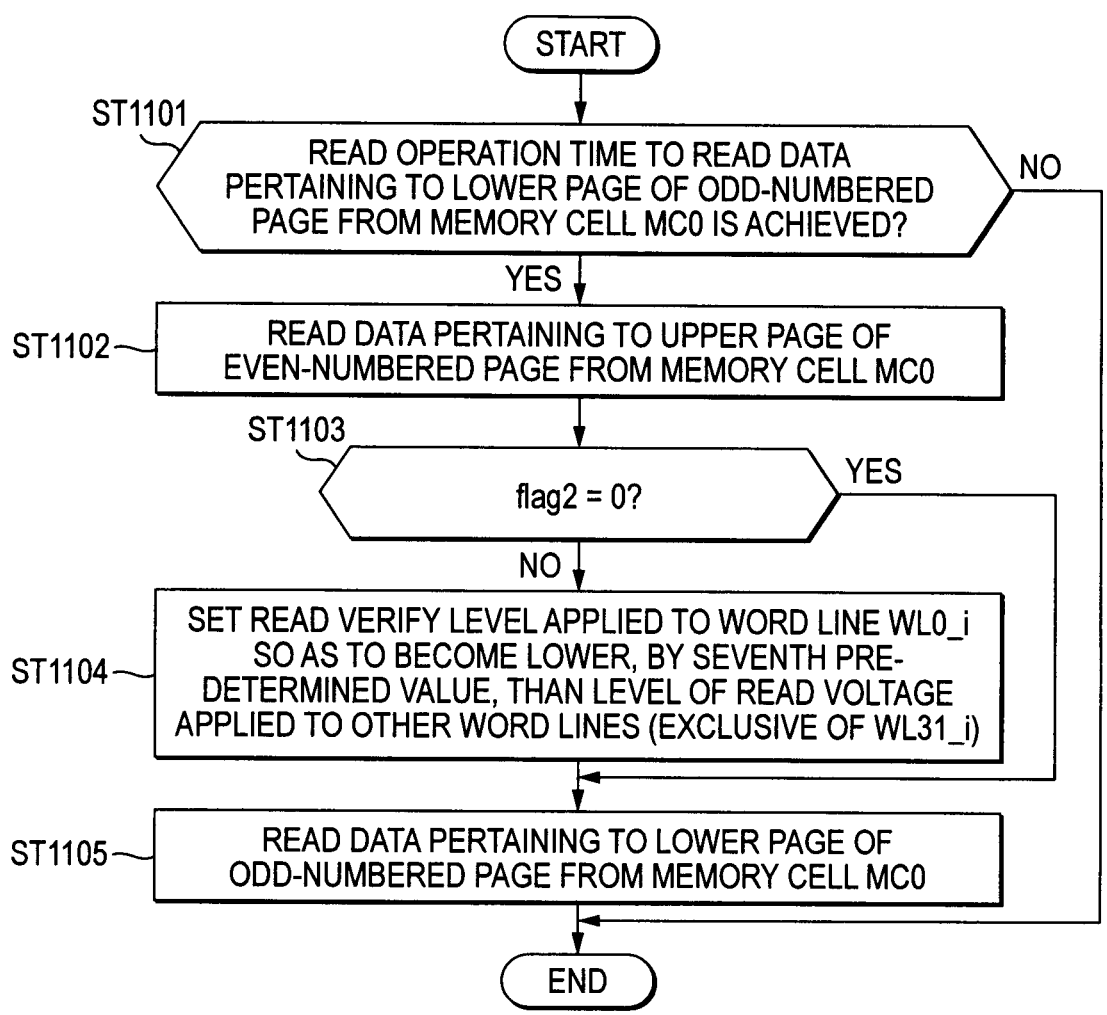
FIG. 17 is an exemplary flowchart for describing a portion of a read-write control section of the fourth embodiment of the present invention.
Figure 18:
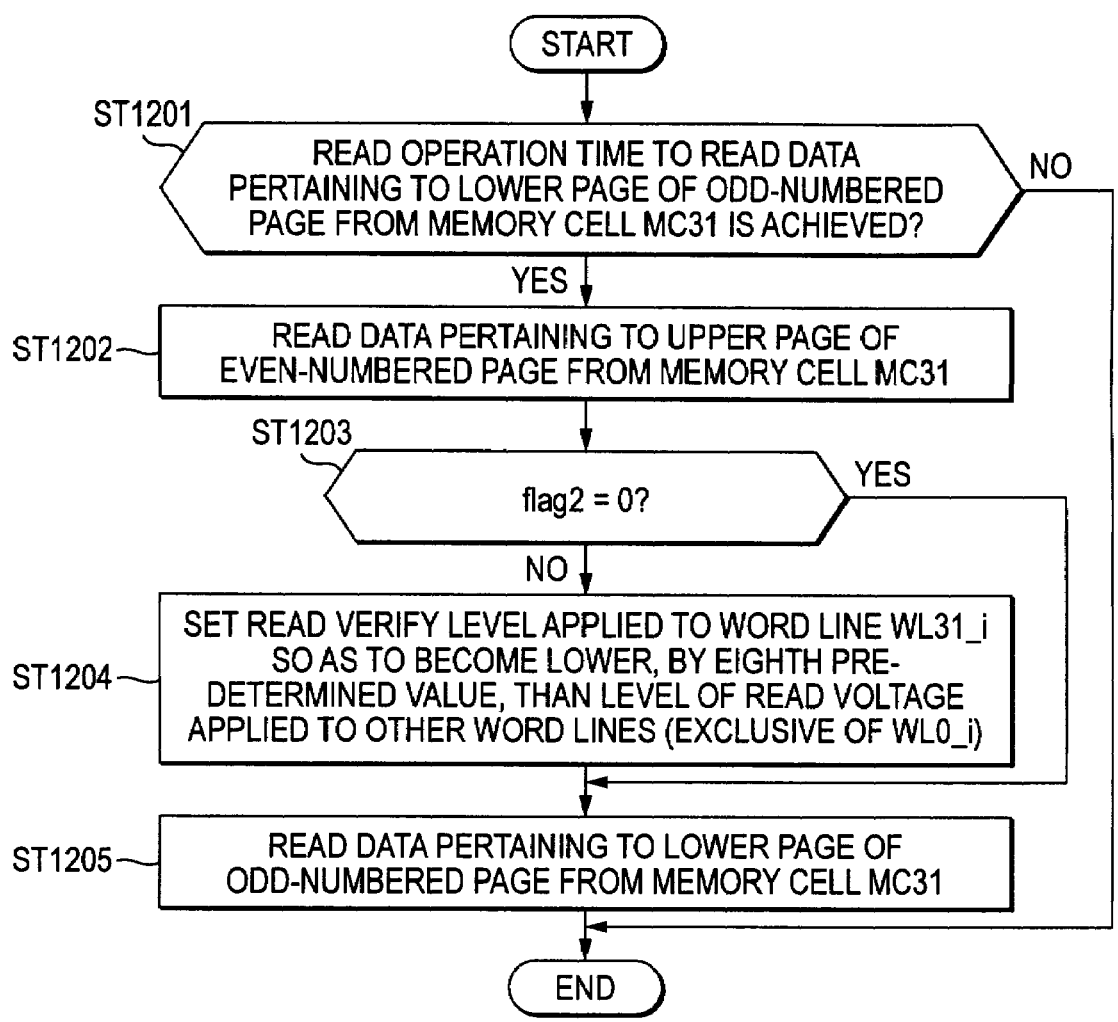
FIG. 18 is an exemplary flowchart for describing a portion of a read-write control section of the fourth embodiment of the present invention.

By reference to FIGS. 13 through 18, operation of the read-write control section of the fourth embodiment of the present invention is described specifically. FIG. 13 is a flowchart for describing a portion of operation for writing data pertaining to an upper page of an even-numbered page into the memory cell MC0 of the read-write control section of the fourth embodiment or data pertaining to a lower page of an odd-numbered page into the memory cell MC0. FIG. 14 is a flowchart for describing a portion of operation for writing data pertaining to the upper page of the even-numbered page into the memory cell MC31 of the read-write control section of the fourth embodiment or data pertaining to the lower page of the odd-numbered page into the memory cell MC31. FIG. 15 is a flowchart for describing a portion of operation for reading data pertaining to the upper page of the even-numbered page from the memory cell MC0 of the read-write control section of the fourth embodiment. FIG. 16 is a flowchart for describing a portion of operation for reading data pertaining to the upper page of the even-numbered page from the memory cell MC31 of the read-write control section of the fourth embodiment. FIG. 17 is a flowchart for describing a portion of operation for reading data pertaining to the lower page of the even-numbered page from the memory cell MC0 of the read-write control section of the fourth embodiment. FIG. 18 is a flowchart for describing a portion of operation for reading data pertaining to a lower page of the even-numbered page from the memory cell MC31 of the read-write control section of the fourth embodiment.

As shown in FIG. 13, in step ST701, the read-write control section determines whether or not a write operation time to write data pertaining to an upper page of an even-numbered page into the memory cell MC0 is achieved.

When the write operation time to write data pertaining to the lower page of the even-numbered page into the memory cell MC0 is determined to be achieved in step ST701, the read-write control section sets the write verify level applied to the word line WL0_i so as to become lower than the write verify level applied to other word lines (exclusive of the word line WL31_i) by the first predetermined value (step ST702).

Next, the read-write control section writes data pertaining to the lower page of the even-numbered page into the memory cell MC0 (step ST703).

When the write operation time to write data pertaining to an upper page of an even-numbered page into the memory cell MC0 is determined not to have been achieved in step ST701 or after processing pertaining to step ST703, the read-write control section determines whether or not the write operation time to write data pertaining to a lower page of an odd-numbered page into the memory cell MC0 is achieved (step ST704).

When the write operation time to write data pertaining to a lower page of an odd-numbered page into the memory cell MC0 is determined to be achieved in step ST704, the read-write control section sets a write verify level applied to the word line WL0_i so as to become lower than the write verify level applied to other word lines (exclusive of the word line WL31_i) by the third predetermined value (step ST705).

Next, the read-write control section writes data pertaining to the lower page of the odd-numbered page into the memory cell MC0 (step ST706).

As shown in FIG. 14, in step ST801, the read-write control section determines whether or not a write operation time to write data pertaining to an upper page of an even-numbered page into the memory cell MC31 is achieved.

When the write operation time to write data pertaining to an upper page of an even-numbered page into the memory cell MC31 is determined to be achieved in step ST801, the read-write control section sets a write verify level applied to the word line WL31_i so as to become lower than the write verify level applied to other word lines (exclusive of the word line WL0_i) by the second predetermined value (step ST802).

Next, the read-write control section writes data pertaining to the lower page of the odd-numbered page into the memory cell MC31 (step ST803).

When the write operation time to write data pertaining to an upper page of an even-numbered page into the memory cell MC31 is determined not to have been achieved in step ST701 or after processing pertaining to step ST803, the read-write control section determines whether or not the write operation time to write data pertaining to a lower page of an odd-numbered page into the memory cell MC31 is achieved (step ST804).

When the write operation time to write data pertaining to a lower page of an odd-numbered page into the memory cell MC31 is determined to be achieved in step ST804, the read-write control section sets a write verify level applied to the word line WL31_i so as to become lower than the write verify level applied to other word lines (exclusive of the word line WL0_i) by the fourth predetermined value (step ST805).

Next, the read-write control section writes data pertaining to the lower page of the odd-numbered page into the memory cell MC31 (step ST806).

As shown in FIG. 15, in step ST901, the read-write control section determines whether or not a write operation time to write data pertaining to an upper page of an even-numbered page into the memory cell MC0 is achieved.

When the read operation time to read data pertaining to an upper page of an even-numbered page from the memory cell MC0 is determined to be achieved in step ST901, the read-write control section reads data pertaining to an upper page of an odd-numbered page from the memory cell MC0 (step ST902).

On the basis of a result of reading of data performed in step ST902, the read-write control section determines whether or not flag2 of the data pertaining to the upper page of the odd-numbered page in the memory cell MC0 is equal to zero (step ST903).

When flag2 is determined not to be equal to zero in step ST903, the read-write control section sets a read level applied to the word line WL0_i so as to become lower than the level of the read level applied to other word lines (exclusive of the word line WL31_i) by the third predetermined value (step ST904).

When flag2=0 is determined in step ST903 or after processing pertaining to step ST904, the read-write control section reads the data pertaining to the upper page of the even-numbered page from the memory cell MC0 (step ST905).

As shown in FIG. 16, in step ST1001, the read-write control section determines whether or not a read operation time to read data pertaining to an upper page of an even-numbered page from the memory cell MC31 is achieved.

When the read operation time to read the data pertaining to the upper page of the even-numbered page from the memory cell MC31 is determined to be achieved in step ST1001, the read-write control section reads data pertaining to an upper page of an odd-numbered page from the memory cell MC31 (step ST1002).

On the basis of a result of reading of data performed in step ST1002, the read-write control section determines whether or not flag2 of the data pertaining to the upper page of the odd-numbered page from the memory cell MC31 is equal to zero (step ST1003).

When flag2 is determined not to be equal to zero in step ST1003, the read-write control section sets a read level applied to the word line WL31_i so as to become lower than the level of the read level applied to other word lines (exclusive of the word line WL0_i) by the sixth predetermined value (step ST1004).

When flag2=0 is determined in step ST1003 or after processing pertaining to step ST1004, the read-write control section reads the data pertaining to the upper page of the even-numbered page from the memory cell MC31 (step ST1005).

As shown in FIG. 17, in step ST1101, the read-write control section determines whether or not a read operation time to read data pertaining to a lower page of an odd-numbered page from the memory cell MC0 is achieved.

When the read operation time to read the data pertaining to the lower page of the odd-numbered page from the memory cell MC0 is determined to be achieved in step ST1101, the read-write control section reads data pertaining to an upper page of an even-numbered page from the memory cell MC0 (step ST1102).

On the basis of a result of reading of data performed in step ST1102, the read-write control section determines whether or not flag2 of the data pertaining to the upper page of the even-numbered page from the memory cell MC0 is equal to zero (step ST1103).

When flag2 is determined not to be equal to zero in step ST1103, the read-write control section sets a read level applied to the word line WL0_i so as to become lower than the read level applied to other word lines (exclusive of the word line WL0_i) by the seventh predetermined value (step ST1104).

When flag2=0 is determined in step ST1103 or after processing pertaining to step ST1104, the read-write control section reads the data pertaining to the lower page of the odd-numbered page from the memory cell MC0 (step ST1105).

As shown in FIG. 18, in step ST1201, the read-write control section determines whether or not a read operation time to read data pertaining to a lower page of an odd-numbered page from the memory cell MC31 is achieved.

When the read operation time to read the data pertaining to the lower page of the odd-numbered page from the memory cell MC31 is determined to be achieved in step ST1201, the read-write control section reads data pertaining to an upper page of an even-numbered page from the memory cell MC31 (step ST1202).

On the basis of a result of reading of data performed in step ST1202, the read-write control section determines whether or not flag2 of the data pertaining to the upper page of the even-numbered page from the memory cell MC31 is equal to zero (step ST1203).

When flag2 is determined not to be equal to zero in step ST1203, the read-write control section sets a read level applied to the word line WL31_i so as to become lower than the level of the read level applied to other word lines (exclusive of the word line WL0_i) by the eighth predetermined value (step ST1204).

When flag2=0 is determined in step ST1203 or after processing pertaining to step ST1204, the read-write control section reads the data pertaining to the lower page of the odd-numbered page from the memory cell MC31 (step ST1205).

In the fourth embodiment of the present invention, a write verify level—which is applied to the word lines WL31_i and WL0_i during write operation for writing data pertaining to the upper page of the even-numbered page or data pertaining to the lower page of the odd-numbered page to the MC31 and MC0—is set so as to become lower than a predetermined write verify level applied to other word lines by the first and second predetermined values in connection with the data pertaining to the upper page of the even-numbered data and lower than the predetermined write verify level by the third and fourth predetermined values in connection with the data pertaining to the lower page of the odd-numbered page. A read level—which is applied to the word lines WL31_i and WL0_i when data pertaining to the upper page of the odd-numbered page are not written during read operation for reading data pertaining to an upper page of an even-numbered page from the memory cells MC31 and MC0—is set so as to become lower than a predetermined read level applied to other word lines by the fifth and sixth predetermined values. A read level—which is applied to the word lines WL31_i and WL0_i when data pertaining to the upper page of the even-numbered page are not written during read operation for reading data pertaining to a lower page of an odd-numbered page from the memory cells MC31 and MC0—is set so as to become lower than a predetermined read level applied to other word lines by the seventh and eighth predetermined values. Accordingly, a change in the distribution of the threshold values of the memory cells MC31 and MC0 adjacent to the select gate transistor SGD and the select gate transistor SGS can be cancelled, and a shift in the distribution of the threshold values of the memory cells, which would otherwise be cause by erroneous writing of data, can be cancelled effectively.

Fifth Embodiment

A fifth embodiment of the present invention is now described in detail by reference to the drawings. FIG. 11 is a block diagram showing the configuration of a NAND flash memory device of the fifth embodiment of the present invention. In the fifth embodiment of the present invention, constituent elements which are the same as those of the first embodiment of the present invention are assigned the same reference numerals, and their explanations are omitted.

Figure 19:
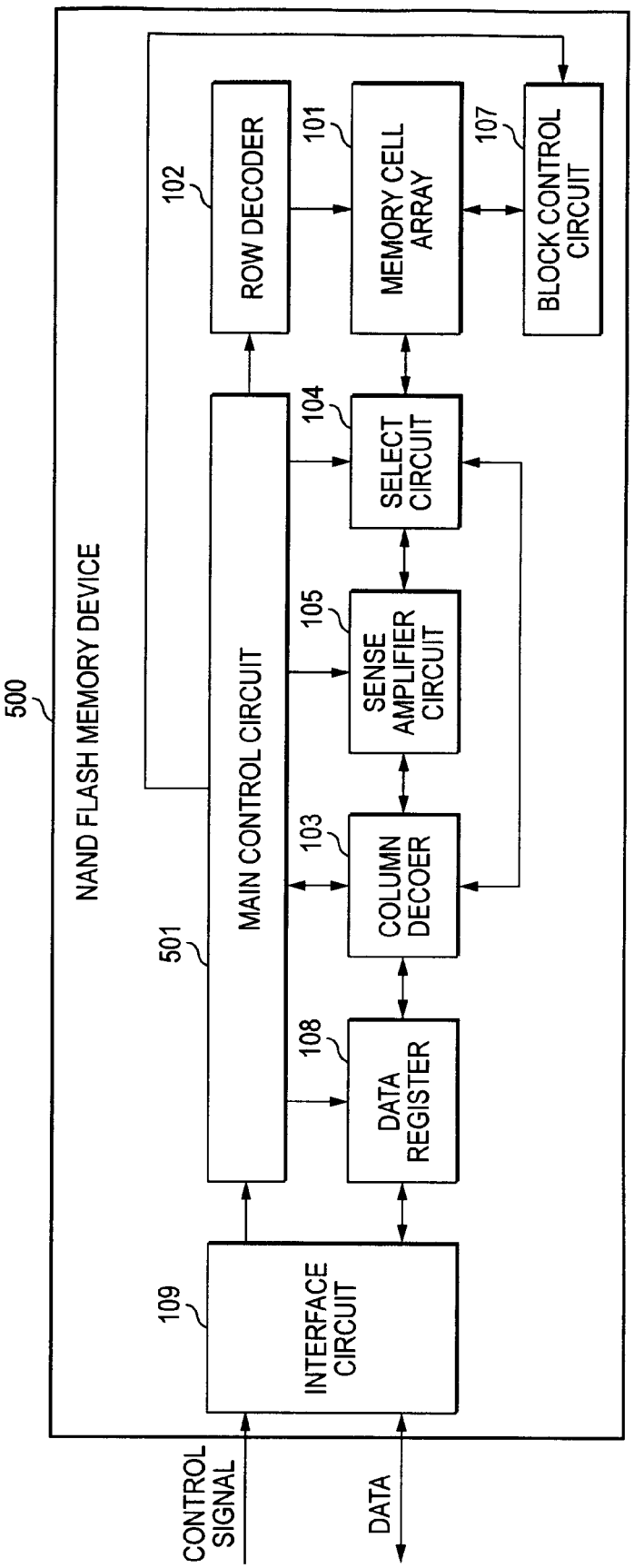
FIG. 19 is an exemplary block diagram showing the configuration of a NAND flash memory device of a fifth embodiment of the present invention.

As shown in FIG. 19, a NAND flash memory device 500 of the fifth embodiment of the present invention has a main control circuit 501 in place of the main control circuit 106 in the NAND flash memory device 100 of the first embodiment of the present invention.

The NAND flash memory device 500 of the fifth embodiment of the present invention has the memory cell array 101; the row decoder 102; the column decoder 103; the select circuit 104; the sense amplifier circuit 105; the main control circuit 501; the block control circuit 107; the data register 108; and the interface circuit 109.

The main control circuit 501, the row decoder 102, the column decoder 103, the sense amplifier circuit 105, the select circuit 104, and the block control section 107 constitute a read-write control section which selectively applies a voltage to the plurality of word lines and the plurality of bit lines during writing and reading of data into or from the plurality of memory cells of the memory cell array 101. The read-write control section has flag1 for each page. Further, the read-write control section has flag2 for each page, too.

In the fifth embodiment of the present invention, the read-write control section sets the read level—which is applied to the word lines WL31_i and WL0_i connected to control gate electrodes of the memory cells MC31 and MC0 when data pertaining to an upper page of an odd-numbered page are written during read operation for reading data pertaining to an upper page of an even-numbered page from the memory cells MC31 and MC0 adjacent to the select gate transistor SGD and the select gate transistor SGS—so as to become higher, by the first and second predetermined values, than a predetermined read level applied to other word lines connected to control gate electrodes of the memory cells except the memory cells MC31 and MC0.

In the fifth embodiment of the present invention, the read-write control section sets the read level—which is applied to the word lines WL31_i and WL0_i connected to control gate electrodes of the memory cells MC31 and MC0 when data pertaining to an upper page of an even-numbered page are written during read operation for reading data pertaining to a lower page of an odd-numbered page from the memory cells MC31 and MC0 adjacent to the select gate transistor SGD and the select gate transistor SGS—so as to become higher, by the third and fourth predetermined values, than a predetermined read level applied to other word lines connected to control gate electrodes of the memory cells except the memory cells MC31 and MC0.

Figure 20:
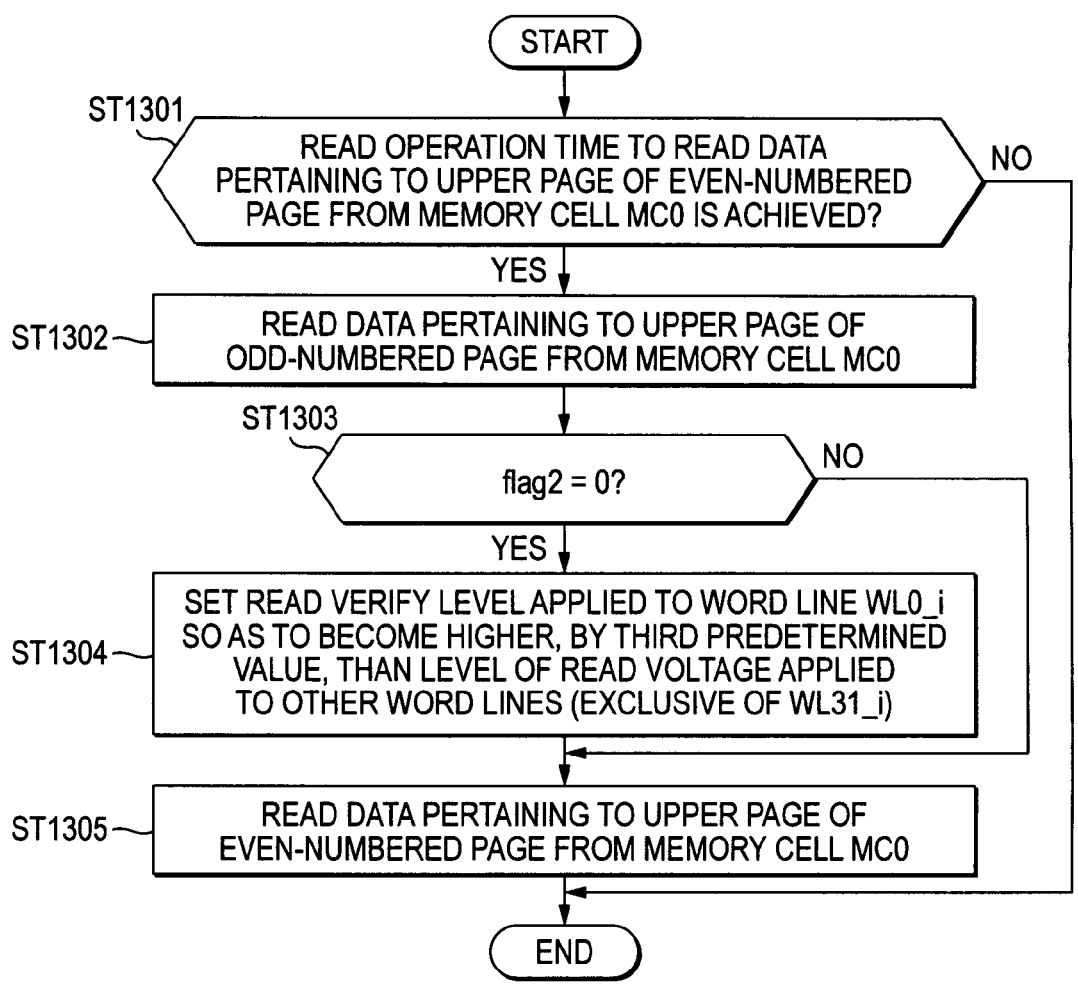
FIG. 20 is an exemplary flowchart for describing a portion of a read-write control section of the fifth embodiment of the present invention.
Figure 21:
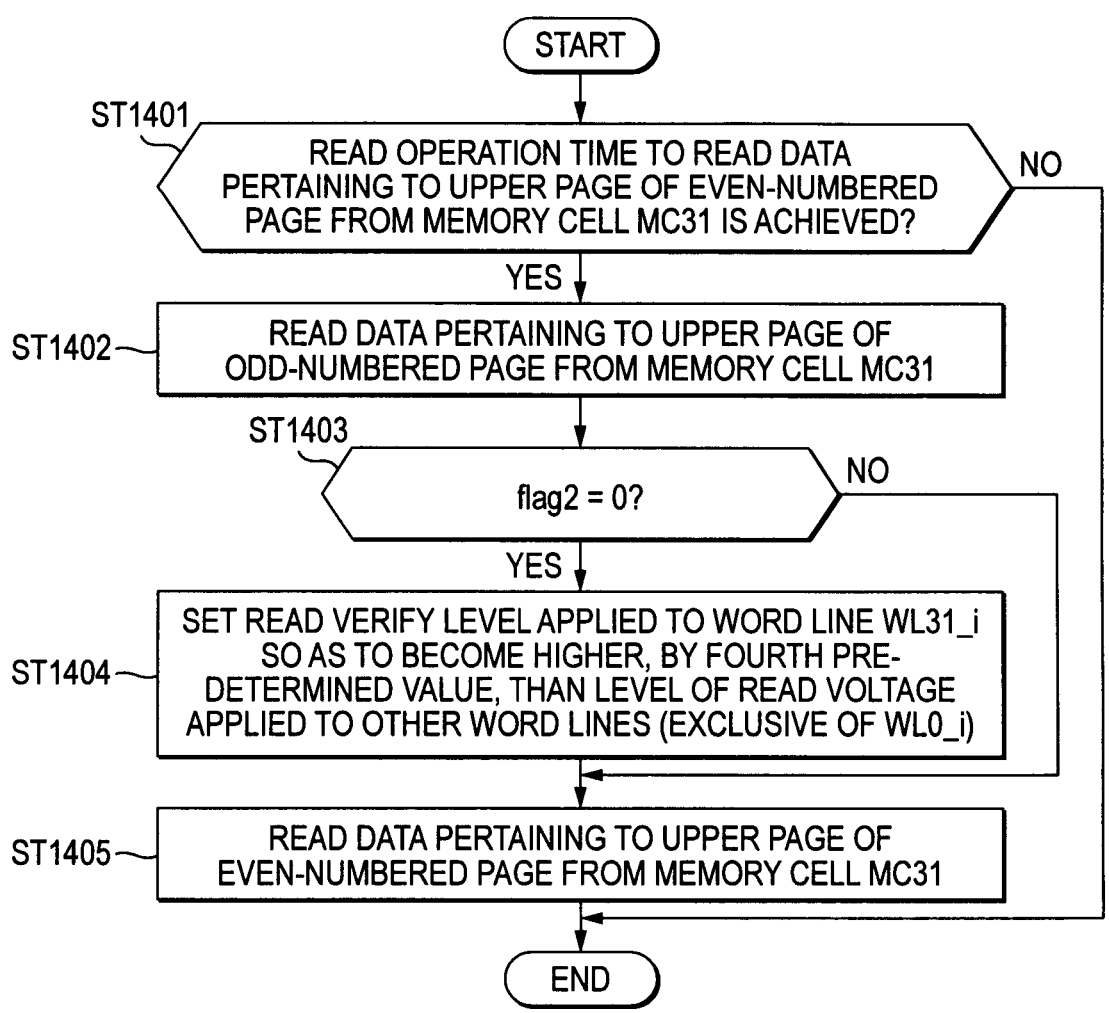
FIG. 21 is an exemplary flowchart for describing a portion of a read-write control section of the fifth embodiment of the present invention.
Figure 22:
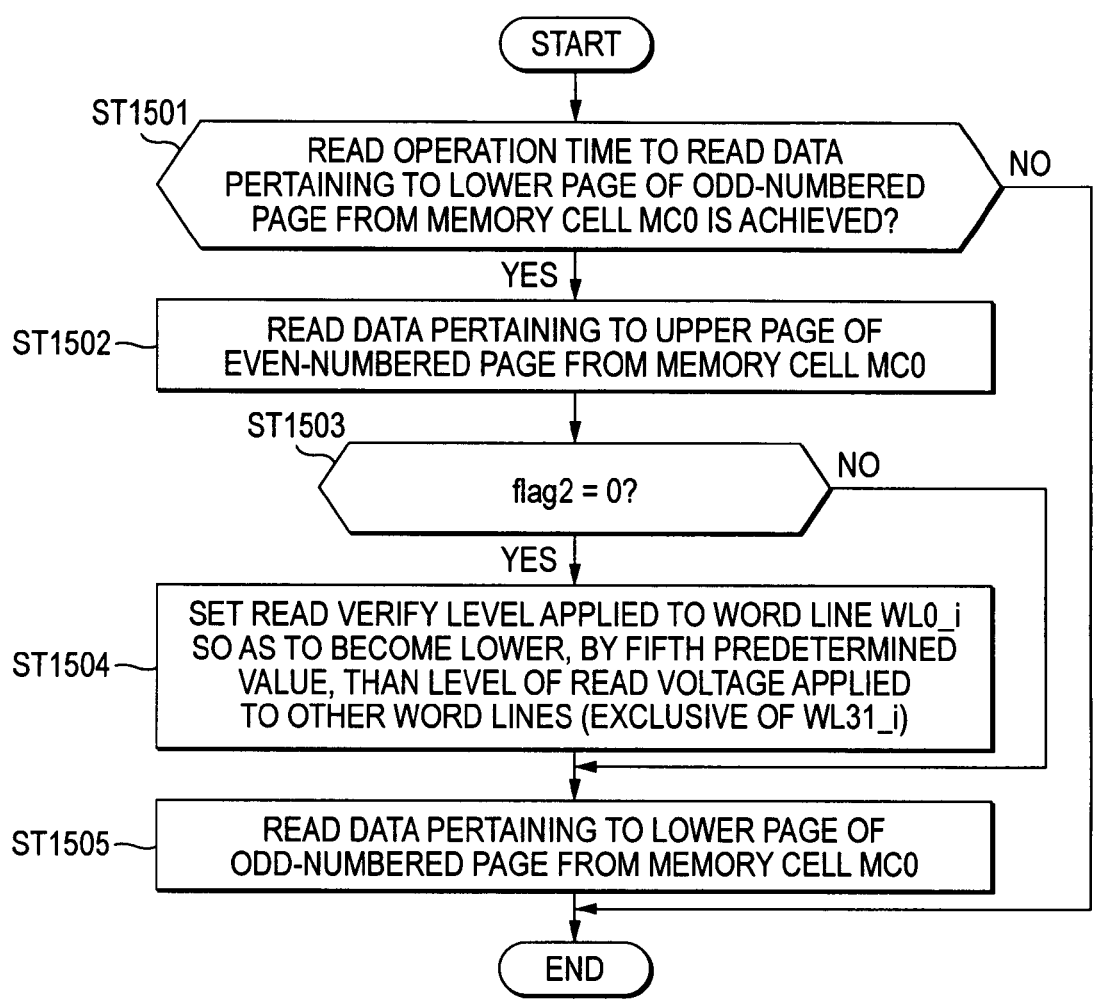
FIG. 22 is an exemplary flowchart for describing a portion of a read-write control section of the fifth embodiment of the present invention.
Figure 23:
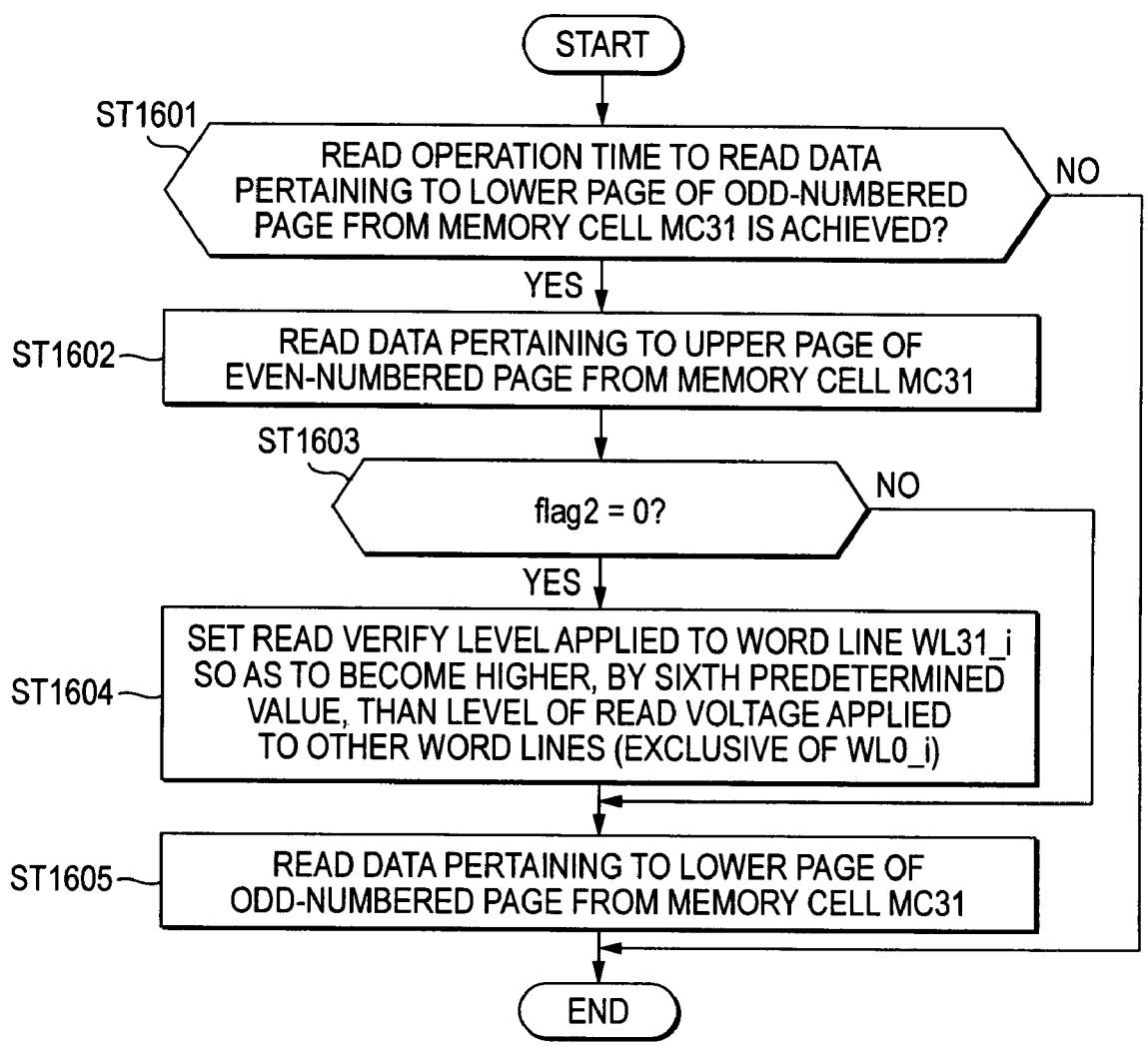
FIG. 23 is an exemplary flowchart for describing a portion of a read-write control section of the fifth embodiment of the present invention

By reference to FIGS. 20 through 23, operation of the read-write control section of the fifth embodiment of the present invention is described specifically. FIG. 20 is a flowchart for describing a portion of operation for reading data pertaining to an upper page of an even-numbered page from the memory cell MC0 of the read-write control section of the fifth embodiment. FIG. 21 is a flowchart for describing a portion of operation for writing data pertaining to the upper page of the even-numbered page into the memory cell MC31 of the read-write control section of the fifth embodiment. FIG. 22 is a flowchart for describing a portion of operation for reading data pertaining to the lower page of the odd-numbered page from the memory cell MC0 of the read-write control section of the fifth embodiment. FIG. 23 is a flowchart for describing a portion of operation for reading data pertaining to the lower page of the odd-numbered page from the memory cell MC31 of the read-write control section of the fourth embodiment.

As shown in FIG. 20, in step ST1301, the read-write control section determines whether or not a read operation time to read data pertaining to an upper page of an even-numbered page from the memory cell MC0 is achieved.

When the read operation time to read data pertaining to the upper page of the even-numbered page into the memory cell MC0 is determined to be achieved in step ST1301, the read-write control section reads data pertaining to the upper page of the odd-numbered page from the memory cell MC0 (step ST1302).

On the basis of a result of reading of data performed in step ST1302, the read-write control section determines whether or not flag2 of the data pertaining to the upper page of the odd-numbered page in the memory cell MC0 is equal to zero (step ST1303).

When flag2 is determined not to be equal to zero in step ST1303, the read-write control section sets a read level applied to the word line WL0_i so as to become lower than the read level applied to other word lines (exclusive of the word line WL31_i) by the third predetermined value (step ST1304).

When flag2=0 is determined in step ST1303 or after processing pertaining to step ST1304, the read-write control section reads the data pertaining to the upper page of the even-numbered page from the memory cell MC0 (step ST1305).

As shown in FIG. 21, in step ST1401, the read-write control section determines whether or not a read operation time to read data pertaining to an upper page of an even-numbered page from the memory cell MC31 is achieved.

When the read operation time to read the data pertaining to the upper page of the even-numbered page from the memory cell MC31 is determined to be achieved in step ST1401, the read-write control section reads data pertaining to an upper page of an odd-numbered page from the memory cell MC31 (step ST1402).

On the basis of a result of reading of data performed in step ST1002, the read-write control section determines whether or not flag2 of the data pertaining to the upper page of the odd-numbered page from the memory cell MC31 is equal to zero (step ST1403).

When flag2 is determined not to be equal to zero in step ST1403, the read-write control section sets a read level applied to the word line WL31_i so as to become lower than the read level applied to other word lines (exclusive of the word line WL0_i) by the fourth predetermined value (step ST1404).

When flag2=0 is determined in step ST1403 or after processing pertaining to step ST1404, the read-write control section reads the data pertaining to the upper page of the even-numbered page from the memory cell MC31 (step ST1405).

As shown in FIG. 22, in step ST1501, the read-write control section determines whether or not a read operation time to read data pertaining to a lower page of an odd-numbered page from the memory cell MC0 is achieved.

When the read operation time to read the data pertaining to the lower page of the odd-numbered page from the memory cell MC0 is determined to be achieved in step ST1501, the read-write control section reads data pertaining to an upper page of an even-numbered page from the memory cell MC0 (step ST1502).

On the basis of a result of reading of data performed in step ST1502, the read-write control section determines whether or not flag2 of the data pertaining to the upper page of the even-numbered page from the memory cell MC0 is equal to zero (step ST1503).

When flag2 is determined to be equal to zero in step ST1503, the read-write control section sets a read level applied to the word line WL0_i so as to become lower than the read level applied to other word lines (exclusive of the word line WL31_i) by the fifth predetermined value (step ST1504).

When flag2=0 is determined in step ST1503 or after processing pertaining to step ST1504, the read-write control section reads the data pertaining to the lower page of the odd-numbered page from the memory cell MC0 (step ST1505).

As shown in FIG. 23, in step ST1601, the read-write control section determines whether or not a read operation time to read data pertaining to a lower page of an odd-numbered page from the memory cell MC31 is achieved.

When the read operation time to read the data pertaining to the lower page of the odd-numbered page from the memory cell MC31 is determined to be achieved in step ST1601, the read-write control section reads data pertaining to an upper page of an even-numbered page from the memory cell MC31 (step ST1602).

On the basis of a result of reading of data performed in step ST1602, the read-write control section determines whether or not flag2 of the data pertaining to the upper page of the odd-numbered page from the memory cell MC31 is equal to zero (step ST1603).

When flag2 is determined not to be equal to zero in step ST1603, the read-write control section sets a read level applied to the word line WL31_i so as to become lower than the read level applied to other word lines (exclusive of the word line WL0_i) by the fourth predetermined value (step ST1604).

When flag2=0 is determined in step ST1403 or after processing pertaining to step ST1604, the read-write control section reads the data pertaining to the upper page of the even-numbered page from the memory cell MC31 (step ST1605).

In the fifth embodiment of the present invention, a read level—which is applied to the word lines WL31_i and WL0_i when data pertaining to an upper page of the odd-numbered page are written during read operation for reading data pertaining to the upper page of the even-numbered page from the memory cells MC31 and MC0—is set so as to become higher than a predetermined read level applied to other word lines by the first and second predetermined values. A read level— which is applied to the word lines WL31_i and WL0_i when data pertaining to the upper page of the even-numbered page are written during read operation for reading data pertaining to a lower page of an odd-numbered page from the memory cells MC31 and MC0—is set so as to become higher than a predetermined read level applied to other word lines by the third and fourth predetermined values. Accordingly, a change in the distribution of the threshold values of the memory cells MC31 and MC0 adjacent to the select gate transistor SGD and the select gate transistor SGS can be cancelled, and a shift in the distribution of the threshold values of the memory cells, which would otherwise be cause by erroneous writing of data, can be cancelled effectively.

In the first through fifth embodiments of the present invention, a statistical change in the distribution of threshold values is measured, to thus determine a change in the distribution of threshold values. The erasure verify level, the write verify level, and the read level can be determined from the change in the distribution of threshold values.

Next, specific examples of the write verify level, the read level, and the erasure verify level will be described. The write verify level is 20V, and a voltage of 10V is applied to the word line of memory cells which are not subjected to writing. The read level for reading data of four values are 1V, 2V, and 3V. A voltage of 5V is applied to the word line of memory cells from which data are not read. A write verify level is higher than the read level by 0.3V. The amount of change in voltage used for increasing or decreasing the verify level is 0.05V (50 mV). The erasure verify level may be set to 0v.

What is claimed is:

1. A NAND flash memory device comprising:
a memory cell array that includes a plurality of NAND memory cell units each including a connection element having a plurality of electrically-rewritable memory cells;
a plurality of word lines that are connected to the plurality of memory cells;
a plurality of bit lines that are connected to the plurality of memory cells; and
a read-write control section that applies a voltage selectively to the plurality of word lines and the plurality of bit lines to perform writing, reading, or erasure of data into or from the plurality of memory cells,
wherein each of the plurality of NAND memory cell units includes a first select gate transistor connected between one end of the connection element and the bit lines and a second select gate transistor connected between the other end of the connection element and a source line; and
wherein the read-write control section sets a voltage level applied to word lines connected to the control gate electrodes of memory cells adjacent to the second select gate transistor, so that the voltage level becomes lower than a predetermined voltage level applied to other word lines connected to control gate electrodes of memory cells except the memory cells adjacent to the second select gate transistor.

2. The NAND flash memory device according to claim 1, wherein, during erasure operation for erasing data from the memory cells adjacent to the second select gate transistor, the voltage level is an erasure verify level.

3. The NAND flash memory device according to claim 2, wherein, during erasure operation for erasing data from the memory cells adjacent to the first select gate transistor, the voltage level is an erasure verify level.

4. The NAND flash memory device according to claim 1, wherein, during write operation for writing data pertaining to a lower page of an even-numbered page to the memory cells adjacent to the second select gate transistor, the voltage level is a write verify level, and
wherein, when data pertaining to a lower page of an odd-numbered page of the memory cells adjacent to the second select gate transistor are not written during read operation for reading data pertaining to the lower page of the even-numbered page from the memory cells adjacent to the second select gate transistor, the voltage level is a read level.

5. The NAND flash memory device according to claim 4, wherein, during write operation for writing data pertaining to the lower page of the even-numbered page to the memory cells adjacent to the first select gate transistor, the voltage level is the write verify level, and
wherein, when data pertaining to the lower page of the odd-numbered page of the memory cells adjacent to the first select gate transistor are not written during read operation for reading data pertaining to the lower page of the even-numbered page from the memory cells adjacent to the first select gate transistor, the voltage level is the read level.

6. A NAND flash memory device comprising:
a memory cell array that includes a plurality of NAND memory cell units each including a connection element having a plurality of electrically-rewritable memory cells;
a plurality of word lines that are connected to the plurality of memory cells;
a plurality of bit lines that are connected to the plurality of memory cells; and
a read-write control section that applies a voltage selectively to the plurality of word lines and the plurality of bit lines to perform writing, reading, or erasure of data into or from the plurality of memory cells,
wherein each of the plurality of NAND memory cell units includes a first select gate transistor connected between one end of the connection element and the bit lines and a second select gate transistor connected between the other end of the connection element and a source line; and
wherein the read-write control section sets a voltage level applied to the word lines connected to the control gate electrodes of memory cells adjacent to the second select gate transistor, so that the voltage level becomes higher than a predetermined voltage level applied to other word lines connected to control gate electrodes of memory cells except the memory cells adjacent to the second select gate transistor.

7. The NAND flash memory device according to claim 6, wherein, when data pertaining to a lower page of an odd-numbered page of the memory cells adjacent to the second select gate transistor are written during read operation for reading data pertaining to a lower page of an even-numbered page from the memory cells adjacent to the second select gate transistor, the voltage level is a read level.

8. The NAND flash memory device according to claim 7, wherein, when data pertaining to the lower page of the odd-numbered page of the memory cells adjacent to the first select gate transistor are written during read operation for reading data pertaining to the lower page of the even-numbered page from the memory cells adjacent to the first select gate transistor, the voltage level is the read level.

9. The NAND flash memory device according to claim 1, wherein, during write operation for writing data pertaining to an upper page of an even-numbered page into the memory cells adjacent to the second select gate transistor, the voltage level is a write verify level, and
wherein, when data pertaining to an upper page of an odd-numbered page of the memory cells adjacent to the second select gate transistor are not written during read operation for reading data pertaining to the upper page of the even-numbered page from the memory cells adjacent to the second select gate transistor, the voltage level is a read level.

10. The NAND flash memory device according to claim 9, wherein, during write operation for writing data pertaining to the upper page of the even-numbered page into the memory cells adjacent to the first select gate transistor, the voltage level is the write verify level, and
wherein, when data pertaining to the upper page of the odd-numbered page of the memory cells adjacent to the first select gate transistor are not written during read operation for reading data pertaining to the upper page of the even-numbered page from the memory cells adjacent to the first select gate transistor, the voltage level is the read level.

11. The NAND flash memory device according to claim 1,
wherein, during write operation for writing data pertaining to a lower page of an odd-numbered page into the memory cells adjacent to the second select gate transistor, the voltage level is a write verify level, and
wherein, when data pertaining to an upper page of an odd-numbered page of the memory cells adjacent to the second select gate transistor are not written during read operation for reading data pertaining to the upper page of the odd-numbered page from the memory cells adjacent to the second select gate transistor, the voltage level is a read level.

12. The NAND flash memory device according to claim 11,
wherein, during write operation for writing data pertaining to the lower page of the odd-numbered page into the memory cells adjacent to the first select gate transistor, the voltage level is the write verify level, and
wherein, when data pertaining to the upper page of the odd-numbered page of the memory cells adjacent to the first select gate transistor are not written during read operation for reading data pertaining to the upper page of the odd-numbered page from the memory cells adjacent to the first select gate transistor, the voltage level is the read level.

13. The NAND flash memory device according to claim 6,
wherein, when data pertaining to an upper page of an odd-numbered page of the memory cells adjacent to the second select gate transistor are written during read operation for reading data pertaining to an upper page of an even-numbered page from the memory cells adjacent to the second select gate transistor, the voltage level is a read level.

14. The NAND flash memory device according to claim 6,
wherein, when data pertaining to the upper page of the odd-numbered page of the memory cells adjacent to the first select gate transistor are written during read operation for reading data pertaining to the upper page of the even-numbered page from the memory cells adjacent to the first select gate transistor, the voltage level is the read level.

15. The NAND flash memory device according to claim 1,
wherein, when data pertaining to an upper page of an even-numbered page of the memory cells adjacent to the second select gate transistor are written during read operation for reading data pertaining to an upper page of an odd-numbered page from the memory cells adjacent to the second select gate transistor, the voltage level is a read level.

16. The NAND flash memory device according to claim 15,
wherein, when data pertaining to the upper page of the even-numbered page of the memory cells adjacent to the first select gate transistor are written during read operation for reading data pertaining to the upper page of the odd-numbered page from the memory cells adjacent to the first select gate transistor, the voltage level is the read level.

17. The NAND flash memory device according to claim 1,
wherein, when the voltage level is set lower than the predetermined voltage level, the voltage level is 0.

* * * * *